United States Patent
Jankus et al.

(10) Patent No.: US 9,923,153 B2
(45) Date of Patent: Mar. 20, 2018

(54) ORGANIC LIGHT EMITTING DIODE COMPRISING AN ORGANIC SEMICONDUCTOR LAYER

(71) Applicant: Novaled GmbH, Dresden (DE)

(72) Inventors: Vygintas Jankus, Dresden (DE); Carsten Rothe, Dresden (DE)

(73) Assignee: NOVALED GMBH, Dresden (DE)

( * ) Notice: Subject to any disclaimer, the term of this patent is extended or adjusted under 35 U.S.C. 154(b) by 0 days.

(21) Appl. No.: 15/606,390

(22) Filed: May 26, 2017

(65) Prior Publication Data

US 2017/0346023 A1 Nov. 30, 2017

(30) Foreign Application Priority Data

May 30, 2016 (EP) ..................................... 16172010

(51) Int. Cl.
| | | |
|---|---|---|
| H01L 29/08 | (2006.01) | |
| H01L 51/00 | (2006.01) | |
| H01L 51/52 | (2006.01) | |
| H01L 51/56 | (2006.01) | |
| H01L 51/50 | (2006.01) | |

(52) U.S. Cl.
CPC ........ *H01L 51/0072* (2013.01); *H01L 51/002* (2013.01); *H01L 51/006* (2013.01); *H01L 51/0021* (2013.01); *H01L 51/0058* (2013.01); *H01L 51/0061* (2013.01); *H01L 51/0071* (2013.01); *H01L 51/0089* (2013.01); *H01L 51/504* (2013.01); *H01L 51/5024* (2013.01); *H01L 51/5068* (2013.01); *H01L 51/5234* (2013.01); *H01L 51/56* (2013.01); *H01L 51/0002* (2013.01); *H01L 51/0022* (2013.01); *H01L 51/0052* (2013.01); *H01L 51/5012* (2013.01); *H01L 51/5076* (2013.01); *H01L 2251/558* (2013.01)

(58) Field of Classification Search
None
See application file for complete search history.

(56) References Cited

U.S. PATENT DOCUMENTS

2015/0069351 A1* 3/2015 Kambe ................ C07D 487/14
257/40

FOREIGN PATENT DOCUMENTS

| EP | 2833429 A1 | 2/2015 |
|---|---|---|
| JP | 2008-243932 A | 10/2008 |

OTHER PUBLICATIONS

European Search Report for EP Application No. 16172010.7 dated Nov. 28, 2016 (5 pages).

* cited by examiner

*Primary Examiner* — Cory Eskridge
(74) *Attorney, Agent, or Firm* — Eversheds Sutherland (US) LLP

(57) ABSTRACT

The present invention relates to organic light-emitting diodes that include an anode electrode, a transparent cathode electrode, at least one emission layer and at least one organic semiconductor layer, wherein the at least one emission layer and the at least one organic semiconductor layer is arranged between the anode electrode and the transparent cathode electrode and the organic semiconductor layer includes a first zero-valent metal dopant and a first matrix compound wherein the first matrix comprising at least two phenanthrolinyl groups as well as to a method for manufacturing the same.

18 Claims, 3 Drawing Sheets

ORGANIC LIGHT EMITTING DIODE COMPRISING AN ORGANIC SEMICONDUCTOR LAYER

CROSS REFERENCE TO RELATED APPLICATIONS

This application claims priority to European Application No. 16172010.7, filed May 30, 2016, which is incorporated herein by reference.

The present invention relates to an organic light emitting diode (OLED) comprising a transparent cathode electrode and an organic semiconductor layer, a compound of formula 1 comprised therein and a method of manufacturing the organic light emitting diode (OLED) comprising the organic semiconductor layer.

DESCRIPTION OF THE RELATED ART

Organic light emitting diodes (OLEDs), which are self-emitting devices, have a wide viewing angle, excellent contrast, quick response, high brightness, excellent driving voltage characteristics, and color reproduction. A typical OLED includes an anode electrode, a hole injection layer (HIL), a hole transport layer (HTL), an emission layer (EML), an electron transport layer (ETL), and a cathode electrode, which are sequentially stacked on a substrate. In this regard, the HIL, the HTL, the EML, and the ETL are thin films formed from organic compounds.

When a voltage is applied to the anode electrode and the cathode electrode, holes injected from the anode electrode move to the EML, via the HIL and HTL, and electrons injected from the cathode electrode move to the EML, via the ETL. The holes and electrons recombine in the EML to generate excitons.

Organic light-emitting diodes having transparent cathode electrodes are well known in the art. However, there is the problem of such organic light-emitting diodes that the same suffer from poor performance which may be deduced to the damage caused to underlying layers through sputtering processes, in particular if the underlying layers comprise a metal dopant. One approach of the prior art to overcome these problems is to provide an additional sputter protection layer. For example, it is described in US2015069351 that an organic matrix compound may be doped with lithium followed by an acceptor layer (CNHAT) and a transparent cathode.

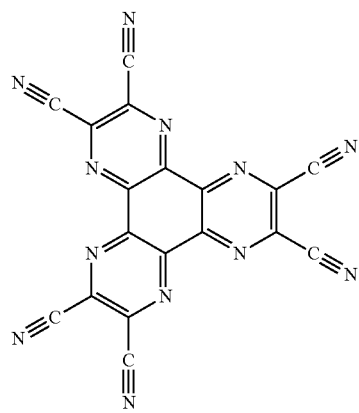

CNHAT

JP2008243932 discloses an organic electroluminescent element. In the organic electroluminescent element, an anode, a luminous function layer and a light-transmitting cathode are laminated in this order. The organic electroluminescent element has an electron transport layer using an organic material shown in a general formula (1) between a light-emitting layer and the cathode. The cathode has a first layer containing an alkali metal element, a second group element or a rare earth element in a transparent conductive material. Where A in the general formula (1) represents a substitutional group having a phenanthroline skeleton or a benzoquinone skeleton, (n) represents a natural number of 2 or larger and B represents, at least one kind selected from a benzene ring, the substitutional group having a terphenyl skeleton and a naphthalene ring. Where all A contain at least one of an alkyl group and an aryl group in the skeleton when B represents the benzene ring.

SUMMARY

Therefore, it is the object of the present invention to provide OLEDs with transparent cathodes overcoming drawbacks of the prior art, in particular having improved operating voltage, improved yield of working devices and/or a reduced number of layers and compounds in the device.

This object is achieved by an organic light emitting diode comprising an anode electrode, a transparent cathode electrode, at least one emission layer and at least one organic semiconductor layer, wherein the at least one emission layer and the at least one organic semiconductor layer is arranged between the anode electrode and the transparent cathode electrode and the organic semiconductor layer comprises a first zero-valent metal dopant and a first matrix compound wherein the first matrix comprising at least two phenanthrolinyl groups, preferably two to four phenanthrolinyl groups;

wherein the first zero-valent metal dopant is selected from the group consisting of alkali metal, alkaline earth metal, rare earth metal, Group 3 transition metal and mixtures thereof;

wherein the organic semiconductor layer has a thickness of 100 to 500 nm; and wherein the organic semiconductor layer is in direct contact with the transparent cathode electrode layer.

In another aspect, an organic light emitting diode comprising an anode electrode, a transparent cathode electrode, at least one emission layer and at least one organic semiconductor layer, wherein the at least one emission layer and the at least one organic semiconductor layer is arranged between the anode electrode and the transparent cathode electrode and the organic semiconductor layer consists of a first zero-valent metal dopant and a first matrix compound wherein the first matrix comprising at least two phenanthrolinyl groups, preferably two to four phenanthrolinyl groups;

wherein the first zero-valent metal dopant is selected from the group consisting of alkali metal, alkaline earth metal, rare earth metal, Group 3 transition metal and mixtures thereof;

wherein the organic semiconductor layer has a thickness of 100 to 500 nm; and wherein the organic semiconductor layer is in direct contact with the transparent cathode electrode layer.

Preferably, the first matrix compound is a substantially organic compound. More preferred the first matrix compound has a molar mass of 450 to 1100 gram per mole.

The term "substantially organic" shall be understood to encompass compounds which contain the elements C, H, N, O, S, B, P, or Si and are free of metals.

More preferred, the phenanthrolinyl groups are comprised in the first matrix compound by covalent bonding via the three-valent carbon atom adjacent to one of the two nitrogen atoms comprised in the phenanthrolinyl moiety.

Preferably, the first matrix compound is a compound of Formula 1

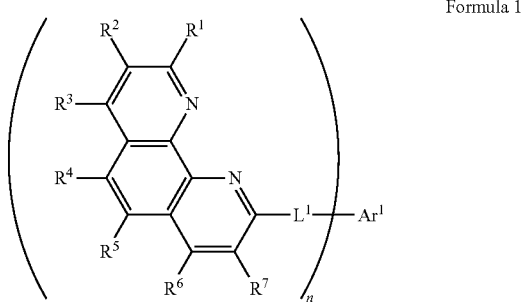

Formula 1 wherein $R^1$ to $R^7$ are each independently selected from the group consisting of hydrogen, substituted or unsubstituted $C_6$ to $C_{18}$ aryl group, substituted or unsubstituted pyridyl group, substituted or unsubstituted quinolyl group, substituted or unsubstituted $C_1$ to $C_{16}$ alkyl group, substituted or unsubstituted $C_1$ to $C_{16}$ alkoxy group, hydroxyl group or carboxyl group, and/or wherein adjacent groups of the respective $R^1$ to $R^7$ may be bonded to each other to form a ring;

$L^1$ is a single bond or selected from a group consisting of a $C_6$ to $C_{30}$ arylene group, a $C_5$ to $C_{30}$ heteroarylene group, a $C_1$ to $C_8$ alkylene group or a $C_1$ to $C_8$ alkoxyalkylene group;

$Ar^1$ is a substituted or unsubstituted $C_6$ to $C_{18}$ aryl group or a pyridyl group; and n is an integer from 2 to 4, wherein each of the n phenanthrolinyl groups within the parentheses may be the same or different from each other.

The term "alkyl" as used herein shall encompass linear as well as branched and cyclic alkyl. For example, $C_3$-alkyl may be selected from n-propyl and iso-propyl. Likewise, $C_4$-alkyl encompasses n-butyl, sec-butyl and t-butyl. Likewise, $C_6$-alkyl encompasses n-hexyl and cyclohexyl.

The subscribed number n in $C_n$ relates to the total number of carbon atoms in the respective alkyl, aryl, heteroaryl or alkoxy group.

The term "aryl" as used herein shall encompass phenyl ($C_6$-aryl), fused aromatics, such as naphthalene, anthracene, phenanthracene, tetracene etc. Further encompassed are biphenyl and oligo- or polyphenyls, such as terphenyl etc. Further encompassed shall be any further aromatic hydrocarbon substituents, such as fluorenyl etc. Arylene refers to groups to which two further moieties are attached.

The term "heteroaryl" as used herewith refers to aryl groups in which at least one carbon atom is substituted by a heteroatom, preferably selected from N, O, S, B or Si. Heteroarylene refers to groups to which two further moieties are attached.

Likewise, the term "alkoxy" as used herein refers to alkoxy groups (—O-alkyl) wherein the alkyl is defined as above.

The subscribed number n in $C_n$-heteroaryl merely refers to the number of carbon atoms excluding the number of heteroatoms. In this context, it is clear that a $C_5$ heteroarylene group is an aromatic compound comprising five carbon atoms, such as pyridyl.

According to the invention, if the respective groups are $R^1$ to $R^7$, $L^1$ and $Ar^1$ are substituted, the groups may preferably be substituted with at least one $C_1$ to $C_{12}$ alkyl group or $C_1$ to $C_{12}$ alkoxy group, more preferably $C_1$ to $C_4$ alkyl group or $C_1$ to $C_4$ alkoxy group. By appropriately choosing the respective substituents, in particular the length of the hydrocarbon chains, the physical behavior of the compounds, for example evaporation rate and/or solubility of the same in organic solvents, can be adjusted.

It is also preferred that n is 2 or 3, preferably 2.

In a further preferred embodiment, $L^1$ is a single bond.

Preferably, $Ar^1$ is phenylene.

More preferred, $R^1$ to $R^7$ are independently selected from the group consisting of hydrogen, $C_1$ to $C_4$ alkyl group, $C_1$ to $C_4$ alkoxy group, $C_6$ to $C_{12}$ aryl group and $C_5$ to $C_{12}$ heteroaryl group, preferably from hydrogen, $C_1$ to $C_4$ alkyl group and phenyl.

Preferably, the phenanthroline groups are comprised in the first matrix compound by covalent bonding via the three-valent carbon atom adjacent to one of the two nitrogen atoms comprised in the phenanthrolinyl moiety.

Preferably, the first matrix compound is selected from the group consisting of

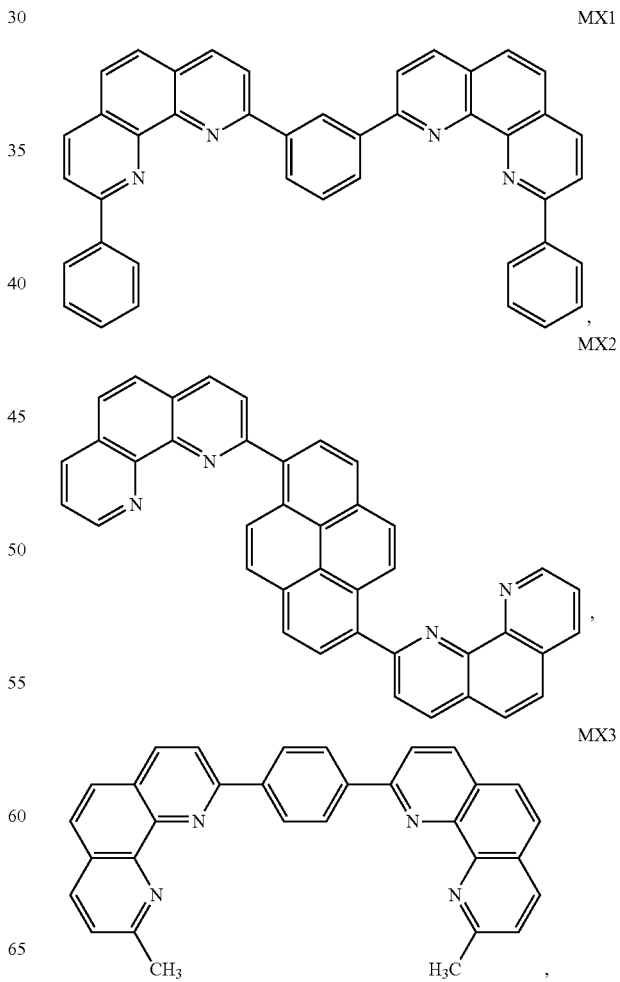

-continued
MX4
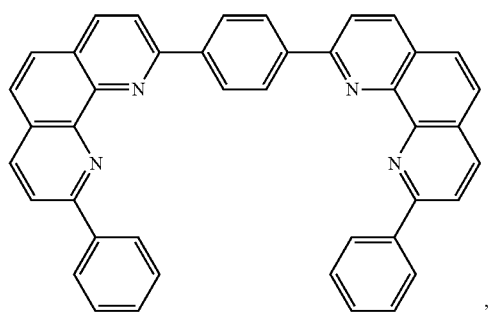
MX5
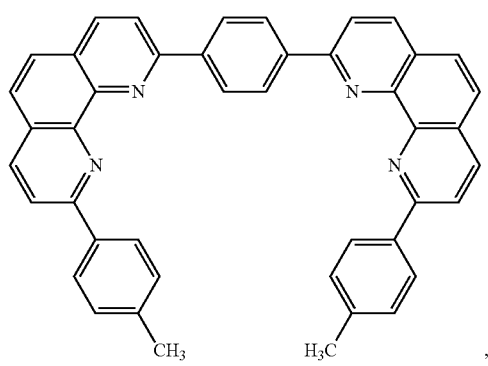
MX6
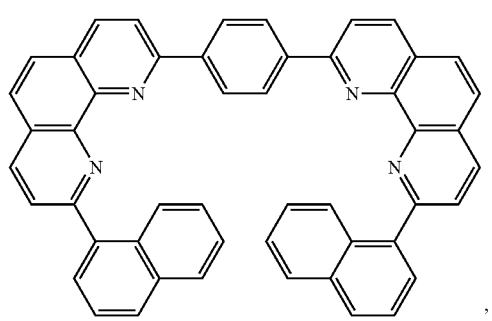
MX7
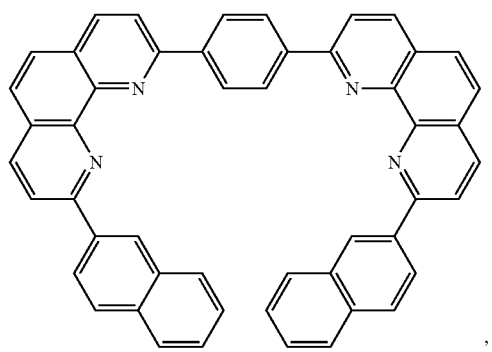
-continued
MX8
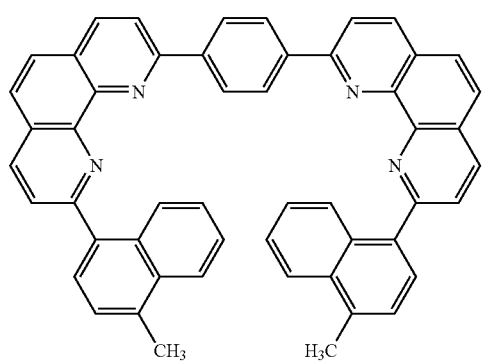
MX9
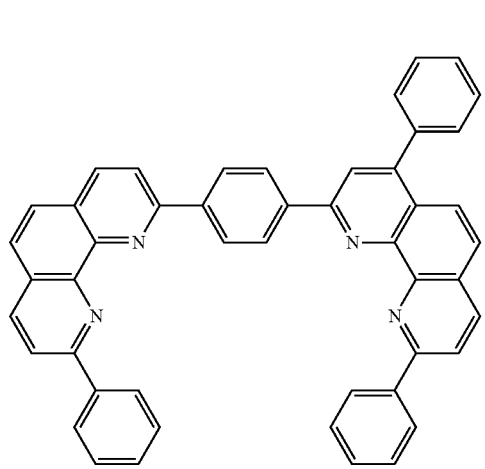
MX10
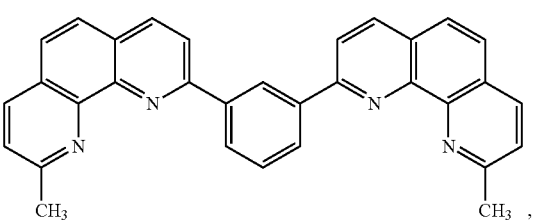
MX11
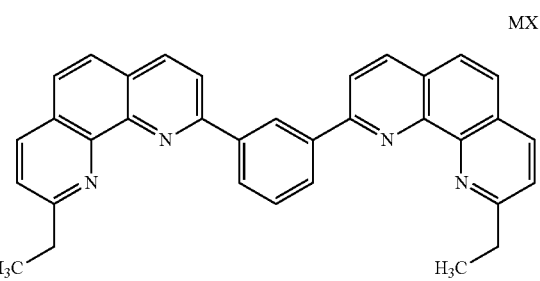

MX12
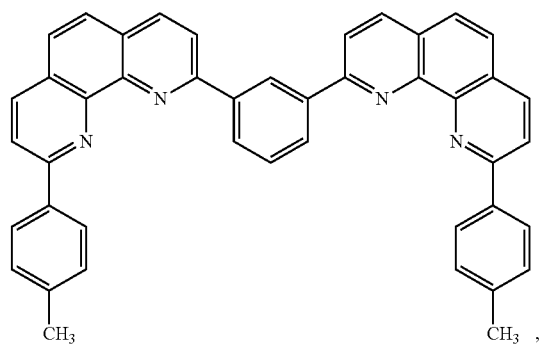
MX16
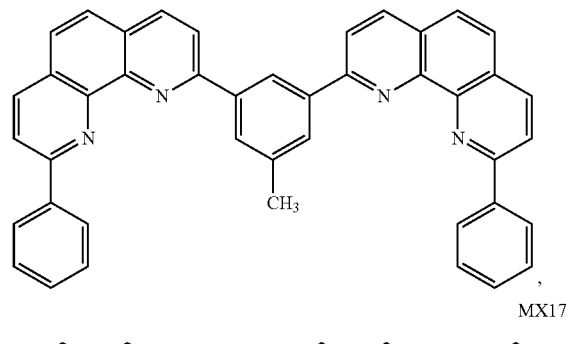
MX13
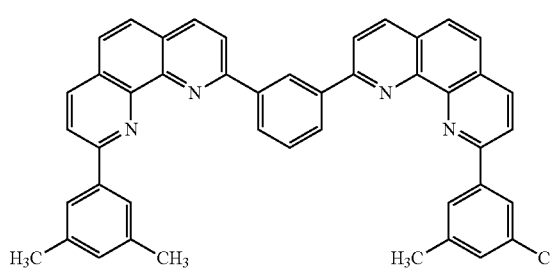
MX17
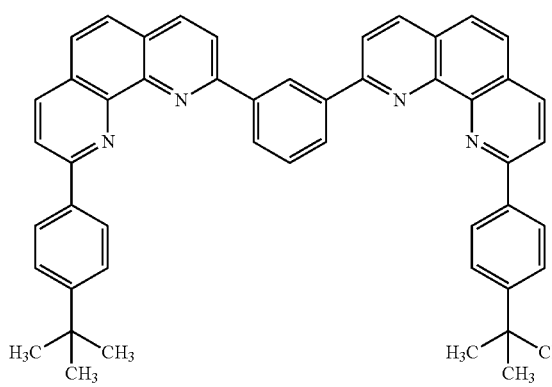
MX14
MX18
MX15
MX19
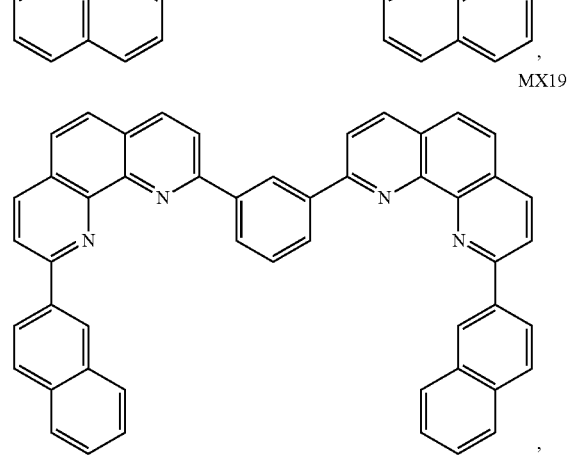
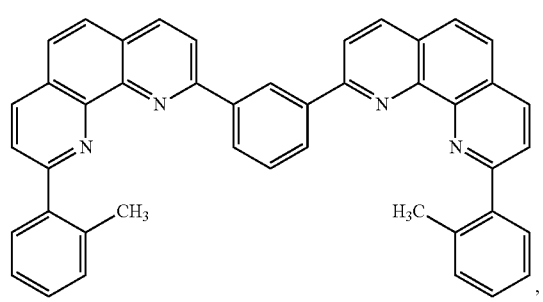
MX20
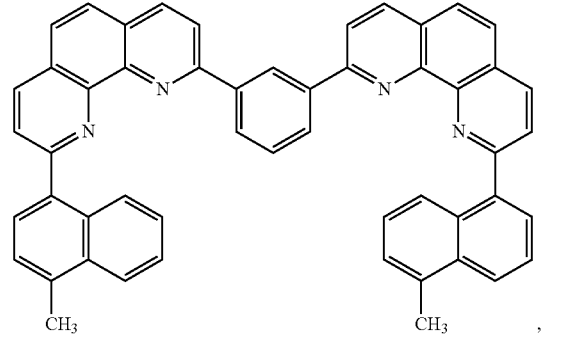

MX21
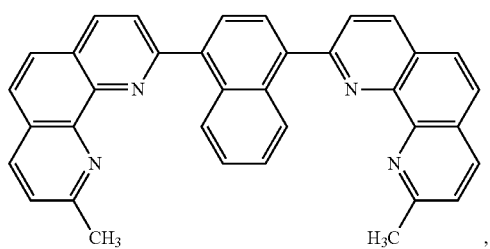
MX22
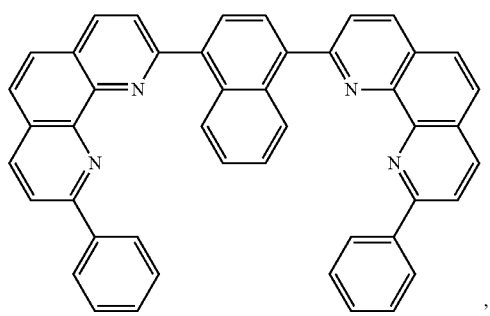
MX23
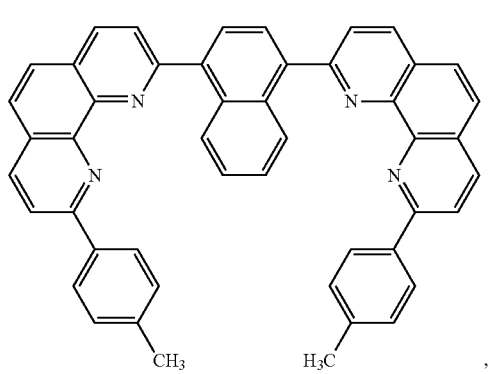
MX24
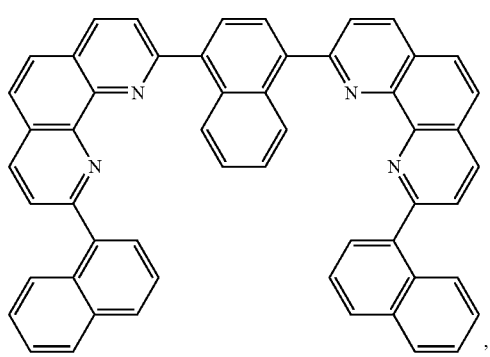
MX25
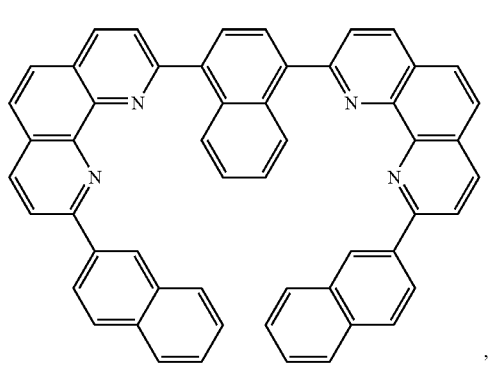
MX26
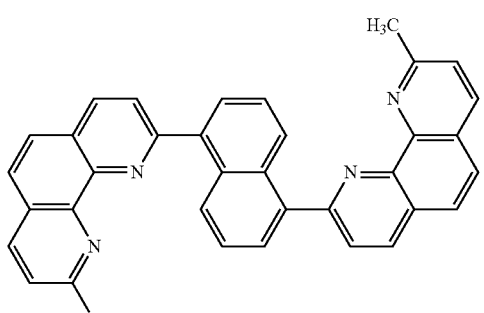
MX27
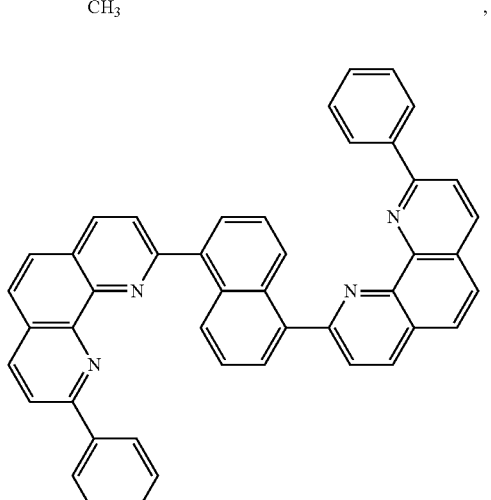
MX28
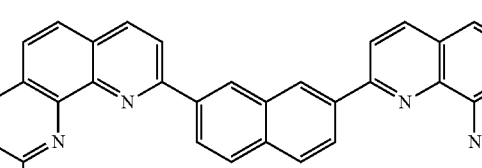
MX29
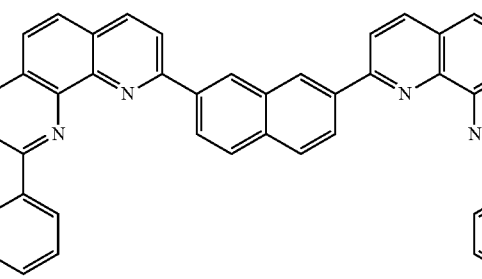
MX30
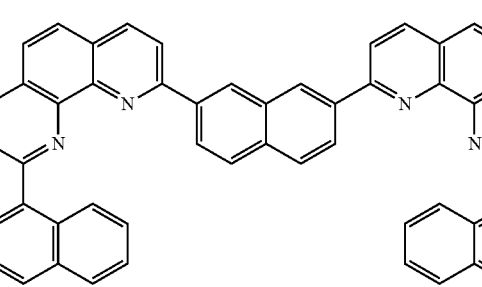

-continued
MX31
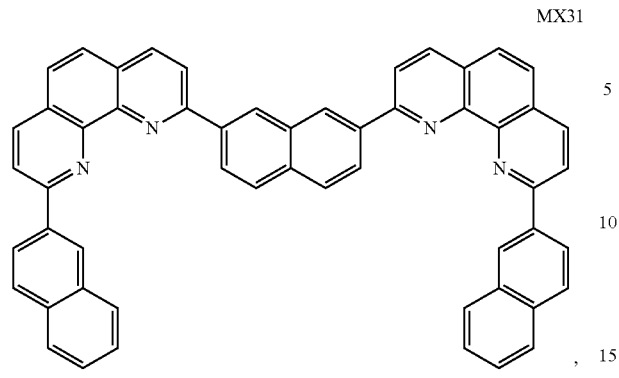
MX32
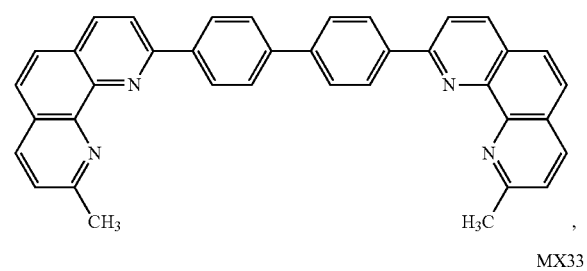
MX33
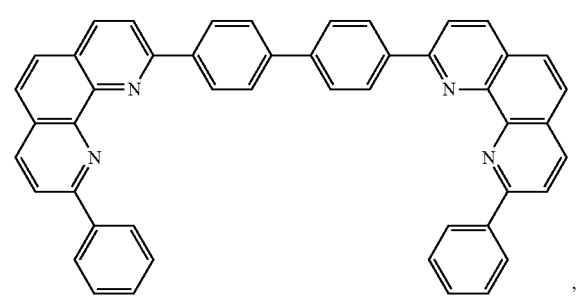
MX34
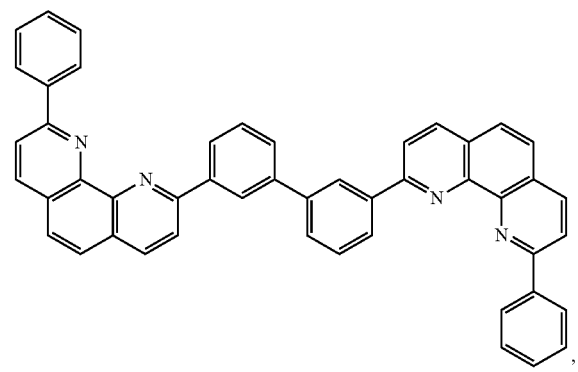
MX35
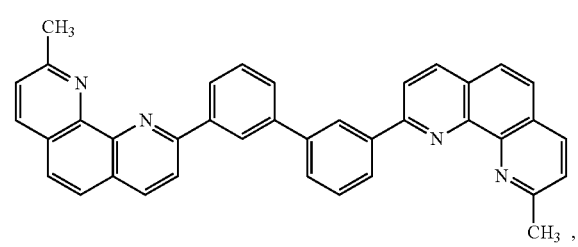
-continued
MX36
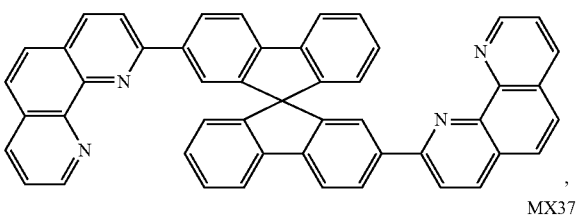
MX37
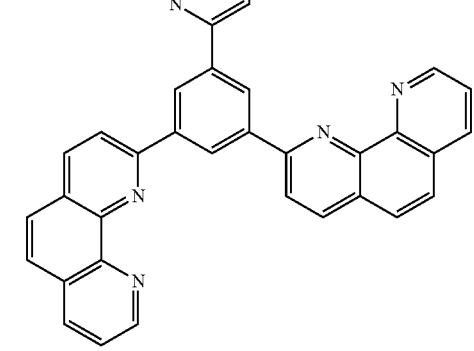
, and
MX38
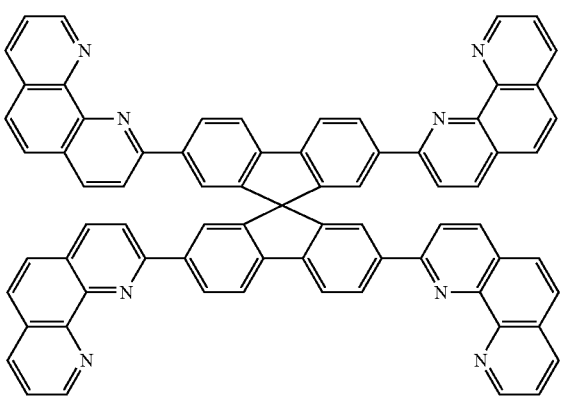
In this regard, it is most preferred that the first matrix compound is
MX1
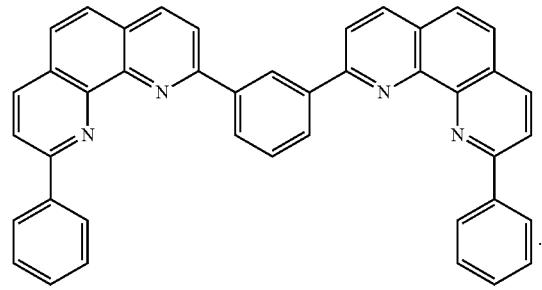
The term "zero-valent" shall be understood to refer to a metal dopant which is not oxidized or reduced, i.e. not a metal ion having a positive (or negative) charge. In particular, the zero-valent metal dopant may be present in the form of elemental metal, metal alloy, atomized metal, metal molecule, metal cluster and the like.

In a further preferred embodiment, the first zero-valent metal dopant is comprised in the organic semiconductor layer in an amount of more than 0.3 wt.-% and less than 30 w.-%, preferably more than 1 wt.-% and less than 20 wt.-%, based on the total weight of the organic semiconductor layer. If the zero-valent metal dopant is selected from alkali metal, the preferred doping concentration may be in the range of 0.3 to 5 wt.-%, preferably 0.3 to 2.5 wt.-%.

If the zero-valent metal dopant is selected from alkaline earth metal, rare earth metal, and or Group 3 transition metals, the preferred doping concentration may be in the range of 1 to 30 wt.-%, preferably 1 to 20 wt.-%, more preferred 1 to 10 wt.-%.

In terms of the invention, a rare earth element or rare earth metal, as defined by the IUPAC, is one of a set of seventeen chemical elements in the Periodic Table, specifically the fifteen lanthanides, as well as scandium and yttrium.

Preferably, the first zero-valent dopant is selected from the group consisting of Li, K, Cs, Mg, Ca, Ba, Sc, Y, La, Sm, Eu and Yb.

In this regard, it is most preferred that the first zero-valent metal dopant is selected from the group consisting of Li, K, Ca, Mg and Yb.

In a further embodiment, the first zero-valent metal dopant is selected from the group consisting of Mg, Ca, Sr, Ba, Sc, Y, La, Sm, Eu and Yb, preferably from the group consisting of Mg, Sm, Eu and Yb. In particular, alkaline earth metals and rare earth metals are used at higher doping concentration in weight percent and it is therefore easier to achieve good reproducibility of doping concentration and OLED performance.

Surprisingly, it has been found that very low operating voltage and/or yield of working OLEDs can be achieved, when the thickness of the organic semiconductor layer of the present invention is selected in the range of 100 to 500 nm, preferably 120 to 400 nm, even more preferred 150 to 200 nm. Opposite to what might have been expected, the operating voltage does not increase when the thickness of the organic semiconductor layer of the present invention is increased to a thickness above 100 nm.

It another embodiment, the transparent cathode electrode comprises a transparent conductive oxide, a metal sulfide, Ag or mixtures thereof. In this regard, it is preferred that the transparent cathode electrode comprises Ag in an amount of more than 50 vol.-%, preferably more than 80 vol.-%.

The transparent cathode electrode may consist of transparent metal oxide, metal sulfide or Ag.

In this regard, the term "transparent" refers to the physical property of allowing at least 50% of visible light emission to pass through the material, preferably at least 80%, more preferably at least 90%.

In another embodiment, the anode electrode and cathode electrode may be transparent to visible light emission.

In another embodiment, the transparent cathode electrode comprises a first cathode electrode layer and a second cathode electrode layer.

Furthermore, it is preferred that the organic semiconductor layer is not the cathode electrode. Preferably, the cathode electrode is free of organic compounds.

In a further embodiment, the organic light emitting diode comprises a first organic semiconductor layer and a second organic semiconductor layer and the organic light emitting diode further comprises a first emission layer and a second emission layer and the first organic semiconductor layer is arranged between the first emission layer and the second emission layer and the second organic semiconductor layer is arranged between the transparent cathode electrode and the emission layer arranged closest to the transparent cathode electrode.

In another embodiment, the at least one organic semiconductor layer is not in direct contact with the at least one emission layer.

It is further preferred that the organic semiconductor layer is essentially non-emissive.

In the context of the present specification the term "essentially non-emissive" means that the contribution from the organic semiconductor layer to the visible emission spectrum from the device is less than 10%, preferably less than 5% relative to the visible emission spectrum. The visible emission spectrum is an emission spectrum with a wavelength of about ≥380 nm to about ≤780 nm.

According to a further preferred embodiment, the organic light emitting diode further comprises at least one electron transport layer, wherein the one or more electron transport layer is arranged between the one or more emission layer and the one or more organic semiconductor layer.

It is preferred that the electron transport layer comprises a polar first matrix compound or a non-polar first matrix compound, preferably a non-polar first matrix compound.

Furthermore, the object is achieved by a method for preparing the inventive organic light-emitting diode, wherein the method comprises a step of co-deposition of a first matrix compound comprising at least two phenanthrolinyl groups together with a first zero-valent metal dopant; wherein the first zero-valent metal dopant is selected from the group consisting of alkali metal, alkaline earth metal, rare earth metal, Group 3 transition metal and mixtures thereof.

In this regard, it is preferred that the process further comprises depositing the transparent cathode layer using a sputtering process, preferably ion beam and/or RF magnetron sputtering.

Surprisingly, it was observed by the inventors that the inventive organic light-emitting diode solves the problem outlined above. In particular, a substantial increase in yield of working devices is achieved without increase in operating voltage. No sputter protection layer is required, i.e. fewer materials are needed and an increased tact time is achieved. As a consequence, the inventive organic light-emitting diode can be prepared in a less time- and resource-intensive manner.

In the present invention, the following defined terms, these definitions shall be applied, unless a different definition is given in the claims or elsewhere in this specification.

In the context of the present specification the term "different" or "differs" in connection with the matrix material means that the matrix material differs in their structural formula.

In the context of the present specification the term "different" or "differs" in connection with the lithium compound means that the lithium compound differs in their structural formula.

The term "free of", "does not contain", "does not comprise" does not exclude impurities which may be present in the compounds prior to deposition. Impurities have no technical effect with respect to the object achieved by the present invention.

Vacuum thermal evaporation, also named VTE, describes the process of heating a compound in a VTE source and evaporating said compound from the VTE source under reduced pressure.

The external quantum efficiency, also named EQE, is measured in percent (%).

The lifetime, also named LT, between starting brightness and 97% of the original brightness is measured in hours (h).

The operating voltage, also named V, is measured in Volt (V) at 10 milliAmpere per square centimeter (mA/cm$^2$) in bottom emission devices and at 15 mA/cm$^2$ in top emission devices.

The color space is described by coordinates CIE-x and CIE-y (International Commission on Illumination 1931). For blue emission the CIE-y is of particular importance. A smaller CIE-y denotes a deeper blue color.

The highest occupied molecular orbital, also named HOMO, and lowest unoccupied molecular orbital, also named LUMO, are measured in electron volt (eV).

The terms "OLED" and "organic electroluminescent device", "organic light-emitting diode" and "organic light emitting diode" are simultaneously used and have the same meaning.

As used herein, "weight percent", "wt.-%", "percent by weight", "% by weight", and variations thereof refer to a composition, component, substance or agent as the weight of that component, substance or agent of the respective electron transport layer divided by the total weight of the respective electron transport layer thereof and multiplied by 100. It is understood that the total weight percent amount of all components, substances and agents of the respective organic semiconductor layer are selected such that it does not exceed 100 wt.-%.

As used herein, "mol percent", "mol.-%", "percent by mol", "% by mol", and variations thereof refer to a composition, component, substance or agent as the molar mass of that component, substance or agent of the respective electron transport layer divided by the total molar mass of the respective electron transport layer thereof and multiplied by 100. It is understood that the total mol percent amount of all components, substances and agents of the respective organic semiconductor layer are selected such that it does not exceed 100 mol.-%.

As used herein, "volume percent", "vol.-%", "percent by volume", "% by volume", and variations thereof refer to a composition, component, substance or agent as the volume of that component, substance or agent of the respective electron transport layer divided by the total volume of the respective electron transport layer thereof and multiplied by 100. It is understood that the total volume percent amount of all components, substances and agents of the cathode layer are selected such that it does not exceed 100 vol.-%.

All numeric values are herein assumed to be modified by the term "about", whether or not explicitly indicated. As used herein, the term "about" refers to variation in the numerical quantity that can occur. Whether or not modified by the term "about" the claims include equivalents to the quantities.

It should be noted that, as used in this specification and the appended claims, the singular forms "a", "an", and "the" include plural referents unless the content clearly dictates otherwise.

Herein, when a first element is referred to as being formed or disposed "on" a second element, the first element can be disposed directly on the second element or one or more other elements may be disposed there between. When a first element is referred to as being formed or disposed "directly on" a second element, no other elements are disposed there between.

The term "contacting sandwiched" refers to an arrangement of three layers whereby the layer in the middle is in direct contact with the two adjacent layers.

The anode electrode and cathode electrode may be described as anode electrode/cathode electrode or anode electrode/cathode electrode or anode electrode layer/cathode electrode layer.

The organic light emitting diode according to the invention may comprise the following constituents. In this regard, the respective constituents may be as follows.

Substrate

The substrate may be any substrate that is commonly used in manufacturing of organic light-emitting diodes. If light is emitted through the substrate, the substrate may be a transparent material, for example a glass substrate or a transparent plastic substrate, having excellent mechanical strength, thermal stability, transparency, surface smoothness, ease of handling, and waterproofness. If light is emitted through the top surface, the substrate may be a transparent or nontransparent material, for example a glass substrate, a plastic substrate, a metal substrate or a silicon substrate.

Anode Electrode

The anode electrode may be formed by depositing or sputtering a compound that is used to form the anode electrode. The compound used to form the anode electrode may be a high work-function compound, so as to facilitate hole injection. The anode material may also be selected from a low work function material (i.e. Aluminum). The anode electrode may be a transparent or reflective electrode. Transparent conductive compounds, such as indium tin oxide (ITO), indium zinc oxide (IZO), tin-dioxide (SnO$_2$), and zinc oxide (ZnO), may be used to form the anode electrode 120. The anode electrode 120 may also be formed using magnesium (Mg), aluminum (Al), aluminum-lithium (Al—Li), calcium (Ca), magnesium-indium (Mg—In), magnesium-silver (Mg—Ag), silver (Ag), gold (Au), or the like.

Transparent Cathode Electrode

The compounds used to form the transparent cathode electrode may be selected from indium tin oxide (ITO), alloy of indium oxide and zinc (IZO), titanium dioxide, tin oxide (NESA), zinc sulfide, Ag, or mixtures thereof.

The thickness of the transparent cathode electrode may be in the range of 5 to 500 nm. If the transparent cathode electrode consists of transparent conductive oxide (TCO) or metal sulfide, the thickness of the transparent cathode electrode may be selected in the range of 30 to 500 nm, preferably 50 to 400 nm, even more preferred 70 to 300 nm. If the transparent cathode electrode consists of Ag, the thickness of the transparent cathode electrode may be selected in the range of 5 to 50 nm, preferably 5 to 20 nm.

In a further embodiment, the transparent cathode electrode comprises a first and a second transparent cathode layer, wherein the first transparent cathode layer is in direct contact with the organic semiconductor layer and the second transparent cathode layer is in direct contact with the first transparent cathode layer.

The first transparent cathode layer may comprise a substantially metallic layer comprising a first zero-valent metal selected from the group consisting of alkali metal, alkaline earth metal, rare earth metal, group 3 transition metal and mixtures thereof.

Particularly low operating voltage and high manufacturing yield may be obtained when the first zero-valent metal is selected from this group.

The term "substantially metallic" shall be understood as encompassing a metal which is at least partially in a substantially elemental form. The term substantially elemental is to be understood as a form that is, in terms of electronic states and energies and in terms of chemical bonds of comprised metals atoms closer to the form of an elemental metal, or a free metal atom or to the form of a cluster of metal atoms, then to the form of a metal salt, of an organometallic metal compound or another compound comprising a covalent bond between metal and non-metal, or to the form of a coordination compound of a metal.

It is to be understood that metal alloys represent beside neat elemental metals, atomized metals, metal molecules and metal clusters, any other example of substantially elemental form of metals. These exemplary representatives of substantially metallic forms are the preferred substantially metallic cathode layer constituents.

In another embodiment, the first zero-valent metal dopant in the organic semiconductor layer and the first transparent cathode layer are selected the same.

In a further embodiment, the transparent cathode electrode comprises a first and a second transparent cathode layer, wherein the first transparent cathode layer comprises a substantially metallic layer comprising a first zero-valent metal selected from the group consisting of alkali metal, alkaline earth metal, rare earth metal, group 3 transition metal and mixtures thereof; and the second transparent cathode layer comprises a transparent conductive oxide, metal sulfide, Ag or mixtures thereof.

In a further embodiment, the transparent cathode electrode comprises a first and a second transparent cathode layer, wherein the first transparent cathode layer consists of a substantially metallic layer comprising a first zero-valent metal selected from the group consisting of alkali metal, alkaline earth metal, rare earth metal, group 3 transition metal and mixtures thereof; and the second transparent cathode layer consists of a transparent conductive oxide, metal sulfide, Ag or mixtures thereof.

The thickness of the first transparent cathode electrode layer may be in the range of 0.2 to 5 nm and the thickness of the second transparent cathode electrode layer may be in the range of 5 to 500 nm, preferably 5 to 200 nm, even more preferred 5 to 150 nm. When the thickness of the first and second cathode layer is in this range, excellent electron injection and yield may be achieved.

According to another aspect there is provided an organic light emitting diode wherein the transparent cathode electrode is free of a metal halide and/or free of a metal organic complex.

Hole Injection Layer

The hole injection layer (HIL) 130 may be formed on the anode electrode 120 by vacuum deposition, spin coating, printing, casting, slot-die coating, Langmuir-Blodgett (LB) deposition, or the like. When the HIL 130 is formed using vacuum deposition, the deposition conditions may vary according to the compound that is used to form the HIL 130, and the desired structure and thermal properties of the HIL 130. In general, however, conditions for vacuum deposition may include a deposition temperature of 100° C. to 500° C., a pressure of $10^{-8}$ to $10^{-3}$ Torr (1 Torr equals 133.322 Pa), and a deposition rate of 0.1 to 10 nm/sec.

When the HIL 130 is formed using spin coating, printing, coating conditions may vary according to a compound that is used to form the HIL 130, and the desired structure and thermal properties of the HIL 130. For example, the coating conditions may include a coating speed of about 2000 rpm to about 5000 rpm, and a thermal treatment temperature of about 80° C. to about 200° C. Thermal treatment removes a solvent after the coating is performed.

The HIL 130 may be formed of any compound that is commonly used to form an HIL. Examples of compounds that may be used to form the HIL 130 include a phthalocyanine compound, such as copper phthalocyanine (CuPc), 4,4',4"-tris (3-methylphenylphenylamino) triphenylamine (m-MTDATA), TDATA, 2T-NATA, polyaniline/dodecylbenzenesulfonic acid (Pani/DBSA), poly(3,4-ethylenedioxythiophene)/poly(4-styrenesulfonate) (PEDOT/PSS), polyaniline/camphor sulfonic acid (Pani/CSA), and polyaniline)/poly(4-styrenesulfonate (PANI/PSS).

The HIL 130 may be a pure layer of p-dopant or may be selected from a hole-transporting matrix compound doped with a p-dopant. Typical examples of known redox doped hole transport materials are: copper phthalocyanine (CuPc), which HOMO level is approximately −5.2 eV, doped with tetrafluoro-tetracyanoquinonedimethane (F4TCNQ), which LUMO level is about −5.2 eV; zinc phthalocyanine (ZnPc) (HOMO=−5.2 eV) doped with F4TCNQ; α-NPD (N,N'-Bis (naphthalen-1-yl)-N,N'-bis(phenyl)-benzidine) doped with F4TCNQ. α-NPD doped with 2,2'-(perfluoronaphthalen-2, 6-diylidene) dimalononitrile (PD1). α-NPD doped with 2,2', 2"-(cyclopropane-1,2,3-triylidene)tris(2-(p-cyanotetrafluorophenyl)acetonitrile) (PD2). Dopant concentrations can be selected from 1 to 20 wt.-%, more preferably from 3 wt.-% to 10 wt.-%.

The thickness of the HIL 130 may be in the range of about 1 nm to about 100 nm, and for example, about 1 nm to about 25 nm. When the thickness of the HIL 130 is within this range, the HIL 130 may have excellent hole injecting characteristics, without a substantial increase in driving voltage.

Hole Transport Layer

The hole transport layer (HTL) 140 may be formed on the HIL 130 by vacuum deposition, spin coating, slot-die coating, printing, casting, Langmuir-Blodgett (LB) deposition, or the like. When the HTL 140 is formed by vacuum deposition or spin coating, the conditions for deposition and coating may be similar to those for the formation of the HIL 130. However, the conditions for the vacuum or solution deposition may vary, according to the compound that is used to form the HTL 140.

The HTL 140 may be formed of any compound that is commonly used to form a HTL. Compound that can be suitably used is disclosed for example in Yasuhiko Shirota and Hiroshi Kageyama, Chem. Rev. 2007, 107, 953-1010 and incorporated by reference. Examples of the compound that may be used to form the HTL 140 are: a carbazole derivative, such as N-phenylcarbazole or polyvinylcarbazole; an amine derivative having an aromatic condensation ring, such as N,N'-bis(3-methylphenyl)-N,N'-diphenyl-[1,1-biphenyl]-4,4'-diamine (TPD), or N,N'-di(naphthalen-1-yl) N,N'-diphenyl benzydine (alpha-NPD); and a triphenylamine-based compound, such as 4,4',4"-tris(N-carbazolyl) triphenylamine (TCTA). Among these compounds, TCTA can transport holes and inhibit excitons from being diffused into the EML.

The thickness of the HTL 140 may be in the range of about 5 nm to about 250 nm, preferably, about 10 nm to about 200 nm, further about 20 nm to about 190 nm, further about 40 nm to about 180 nm, further about 60 nm to about 170 nm, further about 80 nm to about 160 nm, further about 100 nm to about 160 nm, further about 120 nm to about 140 nm. A preferred thickness of the HTL 140 may be 170 nm to 200 nm.

When the thickness of the HTL 140 is within this range, the HTL 140 may have excellent hole transporting characteristics, without a substantial increase in driving voltage.

Electron Blocking Layer

The function of the electron blocking layer (EBL) 150 is to prevent electrons from being transferred from the emission layer to the hole transport layer and thereby confine electrons to the emission layer. Thereby, efficiency, operating voltage and/or lifetime are improved. Typically, the electron blocking layer comprises a triarylamine compound. The triarylamine compound may have a LUMO level closer to vacuum level than the LUMO level of the hole transport layer. The electron blocking layer may have a HOMO level that is further away from vacuum level compared to the HOMO level of the hole transport layer. The thickness of the electron blocking layer is selected between 2 and 20 nm.

The electron blocking layer may comprise a compound of formula Z below

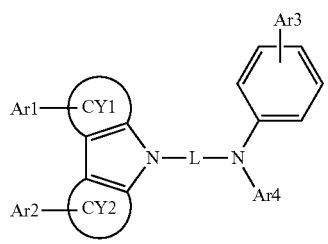

(Z)

In Formula Z, CY1 and CY2 are the same as or different from each other, and each independently represent a benzene cycle or a naphthalene cycle, Ar1 to Ar3 are the same as or different from each other, and each independently selected from the group consisting of hydrogen; a substituted or unsubstituted aryl group having 6 to 30 carbon atoms; and a substituted or unsubstituted heteroaryl group having 5 to 30 carbon atoms, Ar4 is selected from the group consisting of a substituted or unsubstituted phenyl group, a substituted or unsubstituted biphenyl group, a substituted or unsubstituted terphenyl group, a substituted or unsubstituted triphenylene group, and a substituted or unsubstituted heteroaryl group having 5 to 30 carbon atoms, L is a substituted or unsubstituted arylene group having 6 to 30 carbon atoms.

If the electron blocking layer has a high triplet level, it may also be described as triplet control layer.

The function of the triplet control layer is to reduce quenching of triplets if a phosphorescent green or blue emission layer is used. Thereby, higher efficiency of light emission from a phosphorescent emission layer can be achieved. The triplet control layer is selected from triarylamine compounds with a triplet level above the triplet level of the phosphorescent emitter in the adjacent emission layer. Suitable triplet control layer, in particular the triarylamine compounds, are described in EP 2 722 908 A1.

Emission Layer (EML)

The EML 150 may be formed on the HTL by vacuum deposition, spin coating, slot-die coating, printing, casting, LB, or the like. When the EML is formed using vacuum deposition or spin coating, the conditions for deposition and coating may be similar to those for the formation of the HIL. However, the conditions for deposition and coating may vary, according to the compound that is used to form the EML.

The emission layer (EML) may be formed of a combination of a host and a dopant. Example of the host are Alq3, 4,4'-N,N'-dicarbazole-biphenyl (CBP), poly(n-vinylcarbazole) (PVK), 9,10-di(naphthalene-2-yl)anthracene (ADN), 4,4',4"-Tris(carbazol-9-yl)-triphenylamine (TCTA), 1,3,5-tris(N-phenylbenzimidazole-2-yl)benzene (TPBI), 3-tert-butyl-9,10-di-2-naphthylanthracenee (TBADN), distyrylarylene (DSA), Bis(2-(2-hydroxyphenyl)benzo-thiazolate) zinc (Zn(BTZ) 2), E3 below, AND, Compound 1 below, and Compound 2 below.

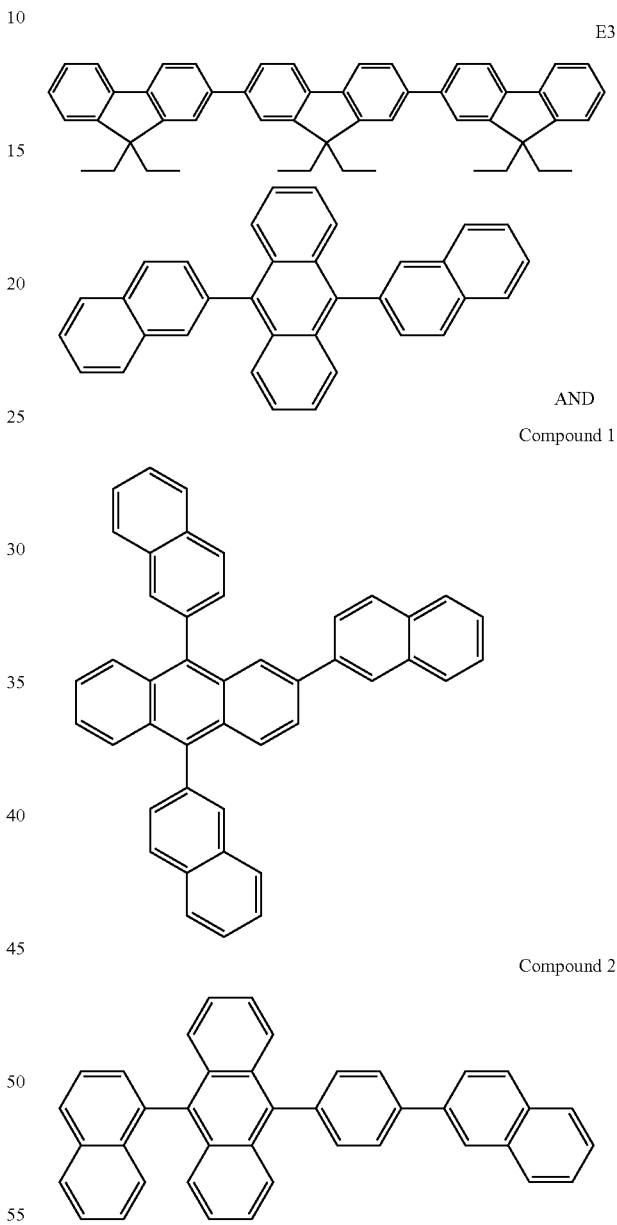

The dopant may be a phosphorescent or fluorescent emitter. Phosphorescent emitters and emitters which emit light via a thermally activated delayed fluorescence (TADF) mechanism are preferred due to their higher efficiency. The emitter may be a small molecule or a polymer.

Examples of a red dopant are PtOEP, Ir(piq) 3, and Btp 2Ir(acac), but are not limited thereto. These compounds are phosphorescent emitters, however, fluorescent red dopants could also be used.

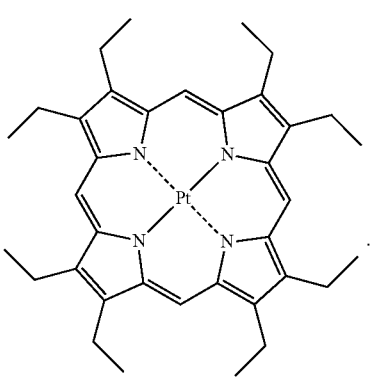

PtOEP

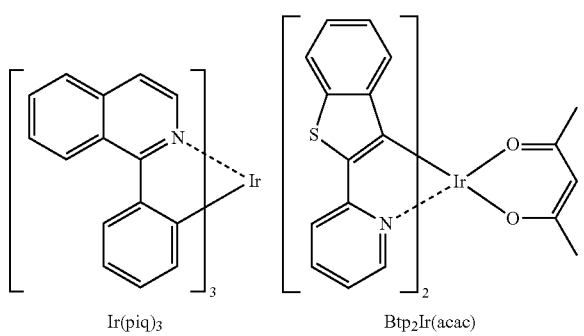

Ir(piq)₃                Btp₂Ir(acac)

Examples of a phosphorescent green dopant are Ir(ppy) 3 (ppy=phenylpyridine), Ir(ppy) 2(acac), Ir(mpyp) 3 are shown below. Compound 3 is an example of a fluorescent green emitter and the structure is shown below.

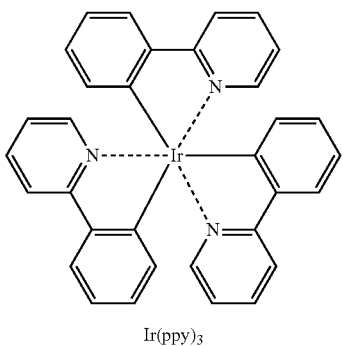

Ir(ppy)₃

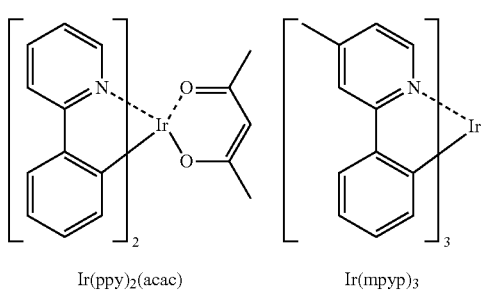

Ir(ppy)₂(acac)          Ir(mpyp)₃

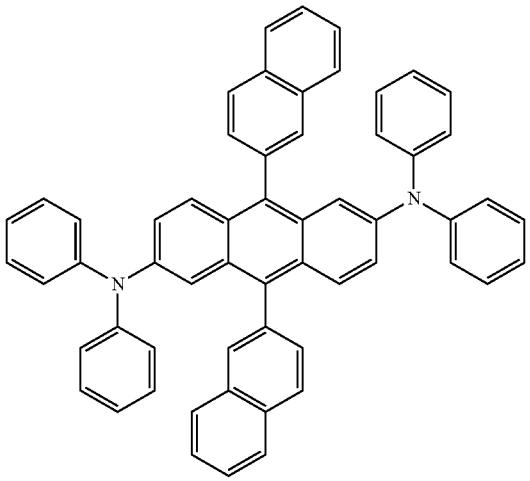

Compound 3

Examples of a phosphorescent blue dopant are F₂Irpic, (F₂ppy)₂Ir(tmd) and Ir(dfppz) 3, ter-fluorene, the structures are shown below. 4,4'-bis(4-diphenyl amiostyryl)biphenyl (DPAVBi), 2,5,8,11-tetra-tert-butyl perylene (TBPe), and Compound 4 below are examples of fluorescent blue dopants.

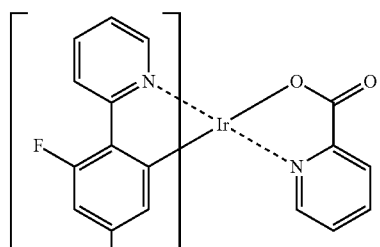

F₂Irpic

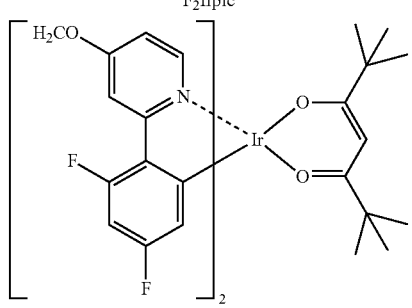

(F₂ppy)₂Ir(tmd)

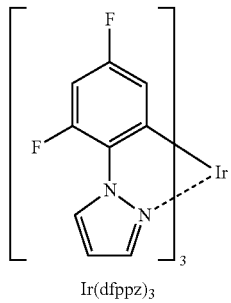

Ir(dfppz)₃

Compound 4

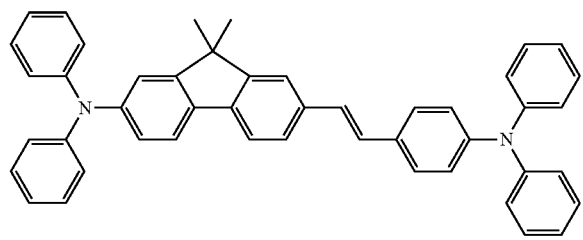

The amount of the dopant may be in the range of about 0.01 to about 50 parts by weight, based on 100 parts by weight of the host. Alternatively, the emission layer may consist of a light-emitting polymer. The EML may have a thickness of about 10 nm to about 100 nm, for example, about 20 nm to about 60 nm. When the thickness of the EML is within this range, the EML may have excellent light emission, without a substantial increase in driving voltage.

Hole Blocking Layer (HBL)

When the EML comprises a phosphorescent dopant, a hole blocking layer (HBL) may be formed on the EML, by using vacuum deposition, spin coating, slot-die coating, printing, casting, LB deposition, or the like, in order to prevent the diffusion of triplet excitons or holes into the ETL.

When the HBL is formed using vacuum deposition or spin coating, the conditions for deposition and coating may be similar to those for the formation of the HIL. However, the conditions for deposition and coating may vary, according to the compound that is used to form the HBL. Any compound that is commonly used to form a HBL may be used. Examples of compounds for forming the HBL include an oxadiazole derivative, a triazole derivative, and a phenanthroline derivative.

The HBL may have a thickness of about 5 nm to about 100 nm, for example, about 10 nm to about 30 nm. When the thickness of the HBL is within this range, the HBL may have excellent hole-blocking properties, without a substantial increase in driving voltage.

Electron Transport Layer

The OLED according to the present invention may not contain an electron transport layer (ETL). However, the OLED according to the present invention may optional contain an electron transport layer (ETL).

The electron transport layer is arranged between the emission layer and the organic semiconductor layer according to the invention. The electron transport layer facilitates electron transport from the organic semiconductor layer according to invention into the emission layer. Preferably, the electron transport layer is contacting sandwiched between the emission layer and the organic semiconductor layer according to the invention. In another preferred embodiment, the electron transport layer is contacting sandwiched between the hole blocking layer and the organic semiconductor layer according to the invention.

Preferably, the electron transport layer is free of emitter dopants. In another preferred aspect, the electron transport layer is free of metal, metal halide, metal salt and/or lithium organic metal complex.

According to various embodiments the OLED may comprises an electron transport layer or an electron transport layer stack comprising at least a first electron transport layer and at least a second electron transport layer.

According to various embodiments of the OLED of the present invention the electron transport layer may comprises at least one matrix compound. Preferably, the at least one matrix compound is a substantially covalent matrix compound. Further preferred, the matrix compound of the electron transport layer is an organic matrix compound.

It is to be understood that "substantially covalent" means compounds comprising elements bound together mostly by covalent bonds. Substantially covalent matrix material consists of at least one substantially covalent compound. Substantially covalent materials can comprise low molecular weight compounds which may be, preferably, stable enough to be processable by vacuum thermal evaporation (VTE). Alternatively, substantially covalent materials can comprise polymeric compounds, preferably, compounds soluble in a solvent and thus processable in form of a solution. It is to be understood that a polymeric substantially covalent material may be crosslinked to form an infinite irregular network, however, it is supposed that such crosslinked polymeric substantially covalent matrix compounds still comprise both skeletal as well as peripheral atoms. Skeletal atoms of the substantially covalent compound are covalently bound to at least two neighboring atoms.

A compound comprising cations and anions is considered as substantially covalent, if at least the cation or at least the anion comprises at least nine covalently bound atoms.

Preferred examples of substantially covalent matrix compounds are organic matrix compounds consisting predominantly from covalently bound C, H, O, N, S, which may optionally comprise also covalently bound B, P, As, Se. Organometallic compounds comprising covalent bonds carbon-metal, metal complexes comprising organic ligands and metal salts of organic acids are further examples of organic compounds that may serve as organic matrix compounds.

According to a more preferred aspect, the organic matrix compound lacks metal atoms and majority of its skeletal atoms is selected from C, O, S, N According to a more preferred aspect, the substantially covalent matrix compound comprises a conjugated system of at least six, more preferably at least ten, even more preferably at least fourteen delocalized electrons.

Examples of conjugated systems of delocalized electrons are systems of alternating pi- and sigma bonds. Optionally, one or more two-atom structural units having the pi-bond between its atoms can be replaced by an atom bearing at least one lone electron pair, typically by a divalent atom selected from O, S, Se, Te or by a trivalent atom selected from N, P, As, Sb, Bi. Preferably, the conjugated system of delocalized electrons comprises at least one aromatic or heteroaromatic ring according to the Hückel rule. Also preferably, the substantially covalent matrix compound may comprise at least two aromatic or heteroaromatic rings which are either linked by a covalent bond or condensed.

Preferably the electron transport layer comprises at least a second matrix compound. Suitable matrix compounds are described in EP15201418.9.

According to a more preferred aspect the second organic matrix compound can be an organic matrix compound and selected from the group comprising benzo[k]fluoranthene, pyrene, anthracene, fluorene, spiro(bifluorene), phenanthrene, perylene, triptycene, spiro[fluorene-9,9'-xanthene], coronene, triphenylene, xanthene, benzofurane, dibenzofurane, dinaphthofurane, acridine, benzo[c]acridine, dibenzo[c,h]acridine, dibenzo[a,j]acridine, triazine, pyridine, pyrimidine, carbazole, phenyltriazole, benzimidazole, phenanthroline, oxadiazole, benzooxazole, oxazole, quinazoline, benzo[h]quinazoline, pyrido[3,2-h]quinazoline, pyrimido[4,5-f]quinazoline, quinoline, benzoquinoline, pyrrolo[2,1-a]isoquinolin, benzofuro[2,3-d]pyridazine, thienopyrimidine, dithienothiophene, benzothienopyrimidine, benzothienopyrimidine, phosphine oxide, phosphole, triaryl borane, 2-(benzo[d]oxazol-2-yl)phenoxy metal complex, 2-(benzo[d]thiazol-2-yl)phenoxy metal complex or mixtures thereof.

According to a more preferred aspect there is provided an organic light emitting diode (OLED) wherein the organic light emitting diode comprises at least one electron transport layer comprising at least a second organic matrix compound, wherein the organic semiconductor layer is contacting sandwiched between the first cathode electrode layer and the electron transport layer. The electron transport layer may comprises a second organic matrix compound with a dipole moment of about ≥0 Debye and about ≤2.5 Debye, preferably ≥0 Debye and <2.3 Debye, more preferably ≥0 Debye and <2 Debye.

According to another aspect there is provided an organic light emitting diode (OLED) wherein the organic light emitting diode comprising at least two electron transport layer of a first electron transport layer and a second electron transport layer. The first electron transport layer may comprises a second organic matrix compound and the second electron transport layer may comprises a third organic matrix compound, wherein the second organic matrix compound of the first electron transport layer may differ from the third organic matrix compound of the second electron transport layer.

According to another embodiment, the dipole moment of the second organic matrix compound may be selected ≥0 Debye and ≤2.5 Debye, the second organic matrix compound can also be described as non-polar matrix compound.

The dipole moment $|\vec{\mu}|$ of a molecule containing N atoms is given by:

$$\vec{\mu} = \sum_{i}^{N} q_i \vec{r}_i$$

$$|\vec{\mu}| = \sqrt{\mu_x^2 + \mu_y^2 + \mu_z^2}$$

where $q_i$ and $\vec{r}_i$ are the partial charge and position of atom i in the molecule. The dipole moment is determined by a semi-empirical molecular orbital method. The values in Table 5 were calculated using the method as described below. The partial charges and atomic positions are obtained using either the DFT functional of Becke and Perdew BP with a def-SV(P) basis or the hybrid functional B3LYP with a def2-TZVP basis set as implemented in the program package TURBOMOLE V6.5. If more than one conformation is viable, the conformation with the lowest total energy is selected to determine the dipole moment.

For example, the second organic matrix compound may have a dipole moment between 0 and 2.5 Debye, the first organic matrix compound may contain a center of inversion I, a horizontal mirror plane, more than one $C_n$ axis (n>1), and/or n $C_2$ perpendicular to $C_n$.

If the second organic matrix compound has a dipole moment between 0 and 2.5 Debye, the first organic matrix compound may contain an anthracene group, a pyrene group, a perylene group, a coronene group, a benzo[k]fluoranthene group, a fluorene group, a xanthene group, a dibenzo[c,h]acridine group, a dibenzo[a,j]acridine group, a benzo[c]acridine group, a triaryl borane group, a dithienothiophene group, a triazine group or a benzothienopyrimidine group.

If the second organic matrix compounds has a dipole moment of about ≥0 Debye and about ≤2.5 Debye, the second organic matrix compound may be free of an imidazole group, a phenanthroline group, a phosphine oxide group, an oxazole group, an oxadiazole group, a triazole group, a pyrimidine group, a quinazoline group, a benzo[h]quinazoline group or a pyrido[3,2-h]quinazoline group.

In a preferred embodiment, the second organic matrix compound is selected from the following compounds or derivatives thereof, the compounds being anthracene, pyrene, coronene, triphenylene, fluorene, spiro-fluorene, xanthene, carbazole, dibenzo[c,h]acridine, dibenzo[a,j]acridine, benzo[c]acridine, triaryl borane compounds, 2-(benzo[d]oxazol-2-yl)phenoxy metal complex; 2-(benzo[d]thiazol-2-yl)phenoxy metal complex, triazine, benzothienopyrimidine, dithienothiophene, benzo[k]fluoranthene, perylene or mixtures thereof.

In a further preferred embodiment, the second organic matrix compound comprises a dibenzo[c,h]acridine compound of formula (2)

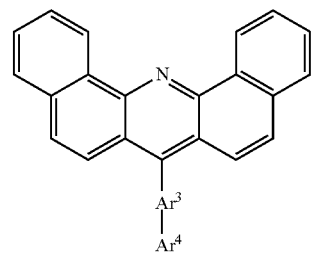

(2)

and/or a dibenzo[a,j]acridine compound of formula (3)

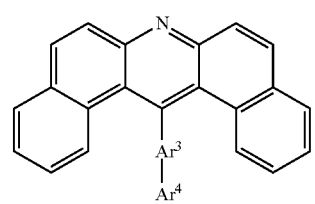

(3)

and/or a benzo[c]acridine compound of formula (4)

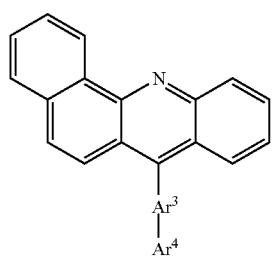

(4)

wherein $Ar^3$ is independently selected from $C_6$-$C_{20}$ arylene, preferably phenylene, biphenylene, or fluorenylene;

Ar⁴ is independently selected from unsubstituted or substituted $C_6$-$C_{40}$ aryl, preferably phenyl, naphthyl, anthranyl, pyrenyl, or phenanthryl;

and in case that Ar⁴ is substituted, the one or more substituents may be independently selected from the group consisting of $C_1$-$C_{12}$ alkyl and $C_1$-$C_{12}$ heteroalkyl, wherein $C_1$-$C_5$ alkyl is preferred.

Suitable dibenzo[c,h]acridine compounds are disclosed in EP 2 395 571. Suitable dibenzo[a,j]acridine are disclosed in EP 2 312 663. Suitable benzo[c]acridine compounds are disclosed in WO 2015/083948.

In a further embodiment, it is preferred that the second organic matrix compound comprises a dibenzo[c,h]acridine compound substituted with $C_6$-$C_{40}$ aryl, $C_5$-$C_{40}$ heteroaryl and/or $C_1$-$C_{12}$ alkyl groups, preferably 7-(naphthalen-2-yl) dibenzo[c,h]acridine, 7-(3-(pyren-1-yl)phenyl)dibenzo[c,h] acridine, 7-(3-(pyridin-4-yl)phenyl)dibenzo[c,h]acridine.

In a further embodiment, it is preferred that the second organic matrix compound comprises a dibenzo[a,j]acridine compound substituted with $C_6$-$C_{40}$ aryl, $C_5$-$C_{40}$ heteroaryl and/or $C_1$-$C_{12}$ alkyl groups, preferably 14-(3-(pyren-1-yl) phenyl)dibenzo[a,j]acridine.

In a further embodiment, it is preferred that the second organic matrix compound comprises a benzo[c]acridine compound substituted with $C_6$-$C_{40}$ aryl, $C_5$-$C_{40}$ heteroaryl and/or $C_1$-$C_{12}$ alkyl groups, preferably 7-(3-(pyren-1-yl) phenyl)benzo[c]acridine.

It may be further preferred that the second organic matrix compound comprises a triazine compound of formula (5)

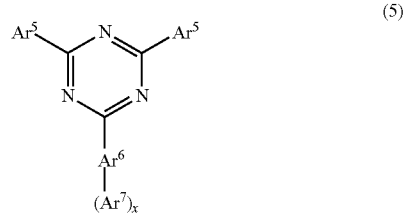

(5)

wherein Ar⁵ is independently selected from unsubstituted or substituted $C_6$-$C_{20}$ aryl or Ar⁵·¹-Ar⁵·², wherein Ar⁵·¹ is selected from unsubstituted or substituted $C_6$-$C_{20}$ arylene and Ar⁵·² is selected from unsubstituted or substituted $C_6$-$C_{20}$ aryl or unsubstituted and substituted $C_5$-$C_{20}$ heteroaryl;

Ar⁶ is selected from unsubstituted or substituted $C_6$-$C_{20}$ arylene, preferably phenylene, biphenylene, terphenylene, fluorenylene;

Ar⁷ is independently selected from a group consisting of substituted or unsubstituted aryl, substituted or unsubstituted heteroaryl, the aryl and the heteroaryl having 6 to 40 ring-forming atoms, preferably phenyl, naphthyl, phenantryl, fluorenyl, terphenyl, pyridyl, quinolyl, pyrimidyl, triazinyl, benzo[h]quinolinyl, or benzo[4,5]thieno[3,2-d]pyrimidine;

x is selected from 1 or 2, wherein in case that Ar⁵ is substituted the one or more substituents may independently be selected from $C_1$-$C_{12}$ alkyl and $C_1$-$C_{12}$ heteroalkyl, preferably $C_1$-$C_5$ alkyl;

and in case that Ar⁷ is substituted, the one or more substituents may be independently selected from $C_1$-$C_{12}$ alkyl and $C_1$-$C_{12}$ heteroalkyl, preferably $C_1$-$C_5$ alkyl, and from $C_6$-$C_{20}$ aryl.

Suitable triazine compounds are disclosed in US 2011/284832, WO 2014/171541, WO 2015/008866, WO2015/105313, JP 2015-074649 A, and JP 2015-126140 and KR 2015/0088712.

Furthermore, it is preferred that the second organic matrix compound comprises a triazine compound substituted with $C_6$-$C_{40}$ aryl, $C_5$-$C_{40}$ heteroaryl and/or $C_1$-$C_{12}$ alkyl groups, preferably 3-[4-(4,6-di-2-naphthalenyl-1,3,5-triazin-2-yl) phenyl]quinolone, 2-[3-(6'-methyl[2,2'-bipyridin]-5-yl)-(5-(9-phenanthrenyl)phenyl]-4,6-diphenyl-1,3,5-triazine, 2-(3-(phenanthren-9-yl)-5-(pyridin-2-yl)phenyl)-4,6-diphenyl-1, 3,5-triazine, 2,4-diphenyl-6-(5'''-phenyl-[1,1':3',1'':3'',1''': 3''',1''''-quinquephenyl]-3-yl)-1,3,5-triazine, 2-([1,1'-biphenyl]-3-yl)-4-(3'-(4,6-diphenyl-1,3,5-triazin-2-yl)-[1,1'-biphenyl]-3-yl)-6-phenyl-1,3,5-triazine and/or 2-(3'-(4,6-diphenyl-1,3,5-triazin-2-yl)-[1,1'-biphenyl]-3-yl)-4-phenylbenzo[4,5]thieno[3,2-d]pyrimidine.

Suitable 2-(benzo[d]oxazol-2-yl)phenoxy metal complex or 2-(benzo[d]thiazol-2-yl)phenoxy metal complex are disclosed in WO 2010/020352.

In a preferred embodiment, the second organic matrix compound comprises a benzothienopyrimidine compound substituted with $C_6$-$C_{40}$ aryl, $C_5$-$C_{40}$ heteroaryl and/or $C_1$-$C_{12}$ alkyl groups, preferably 2-phenyl-4-(4',5',6'-triphenyl-[1,1':2',1'':3'',1'''-quaterphenyl]-3'''-yl)benzo[4,5] thieno[3,2-d]pyrimidine. Suitable benzothienopyrimidine compounds are disclosed in W 2015/0105316.

In a preferred embodiment, the second organic matrix compound comprises a benzo[k]fluoranthene compound substituted with $C_6$-$C_{40}$ aryl, $C_5$-$C_{40}$ heteroaryl and/or $C_1$-$C_{12}$ alkyl groups, preferably 7, 12-diphenylbenzo[k]fluoranthene. Suitable benzo[k]fluoranthene compounds are disclosed in JP10189247 A2.

In a preferred embodiment, the second organic matrix compound comprises a perylene compound substituted with $C_6$-$C_{40}$ aryl, $C_5$-$C_{40}$ heteroaryl and/or $C_1$-$C_{12}$ alkyl groups, preferably 3,9-bis([1,1'-biphenyl]-2-yl)perylene, 3,9-di (naphthalene-2-yl)perylene or 3,10-di(naphthalene-2-yl) perylene. Suitable perylene compounds are disclosed in US2007202354.

In a preferred embodiment, the second organic matrix compound comprises a pyrene compound. Suitable pyrene compounds are disclosed in US20050025993.

In a preferred embodiment, the second organic matrix compound comprises a spiro-fluorene compound. Suitable spiro-fluorene compounds are disclosed in JP2005032686.

In a preferred embodiment, the second organic matrix compound comprises a xanthene compound. Suitable xanthene compounds are disclosed in US2003168970A and WO 2013149958.

In a preferred embodiment, the second organic matrix compound comprises a coronene compound. Suitable coronene compounds are disclosed in Adachi, C.; Tokito, S.; Tsutsui, T.; Saito, S., Japanese Journal of Applied Physics, Part 2: Letters (1988), 27(2), L269-L271.

In a preferred embodiment, the second organic matrix compound comprises a triphenylene compound. Suitable triphenylene compounds are disclosed in US20050025993.

In a preferred embodiment, the second organic matrix compound is selected from carbazole compounds. Suitable carbazole compounds are disclosed in US2015207079.

In a preferred embodiment, the second organic matrix compound is selected from dithienothiophene compounds. Suitable dithienothiophene compounds are disclosed in KR2011085784.

In a preferred embodiment, the second organic matrix compound comprises an anthracene compound. Particularly preferred are anthracene compounds represented by Formula 400 below:

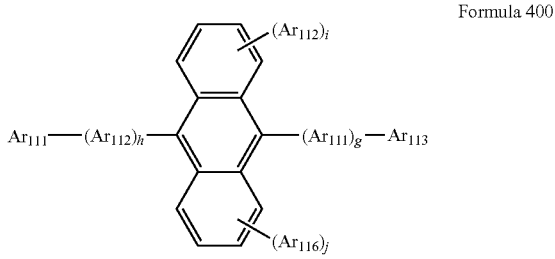

Formula 400

In Formula 400, $Ar_{111}$ and $Ar_{112}$ may be each independently a substituted or unsubstituted $C_6$-$C_{60}$ arylene group; $Ar_{113}$ to $Ar_{116}$ may be each independently a substituted or unsubstituted $C_1$-$C_{10}$ alkyl group or a substituted or unsubstituted $C_6$-$C_{60}$ aryl group; and g, h, i, and j may be each independently an integer from 0 to 4.

In some embodiments, $Ar_{111}$ and $Ar_{112}$ in Formula 400 may be each independently one of a phenylene group, a naphthylene group, a phenanthrenylene group, or a pyrenylene group; or a phenylene group, a naphthylene group, a phenanthrenylene group, a fluorenyl group, or a pyrenylene group, each substituted with at least one of a phenyl group, a naphthyl group, or an anthryl group.

In Formula 400, g, h, i, and j may be each independently an integer of 0, 1, or 2.

In Formula 400, $Ar_{113}$ to $Ar_{116}$ may be each independently one of a $C_1$-$C_{10}$ alkyl group substituted with at least one of a phenyl group, a naphthyl group, or an anthryl group;

a phenyl group, a naphthyl group, an anthryl group, a pyrenyl group, a phenanthrenyl group, or a fluorenyl group;

a phenyl group, a naphthyl group, an anthryl group, a pyrenyl group, a phenanthrenyl group, or a fluorenyl group, each substituted with at least one of a deuterium atom, a halogen atom, a hydroxyl group, a cyano group, a nitro group, an amino group, an amidino group, a hydrazine group, a hydrazone group, a carboxyl group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a phenyl group, a naphthyl group, an anthryl group, a pyrenyl group, a phenanthrenyl group, or a fluorenyl group; or

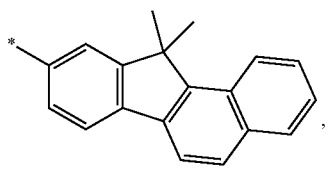 [SMILES: *c1ccc2c(c1)C(C)(C)c1c-2ccc2ccccc12]

, but embodiments of the invention are not limited thereto.

In another aspect, the electron transport layer may comprise a polar second organic matrix compound. Preferably, the second organic matrix compound has a dipole moment of about >2.5 Debye and <10 Debye, preferably >3 and <5 Debye, even more preferred >2.5 and less than 4 Debye.

If an organic matrix compounds has a dipole moment of >2.5 and <10 Debye, the organic matrix compound may be described by one of the following symmetry groups: $C_1$, $C_n$, $C_{nv}$, or $C_s$.

When an organic matrix compound has a dipole moment of >2.5 and <10 Debye, the organic matrix compound may comprise benzofurane, dibenzofurane, dinaphthofurane, pyridine, acridine, phenyltriazole, benzimidazole, phenanthroline, oxadiazole, benzooxazole, oxazole, quinazoline, benzoquinazoline, pyrido[3,2-h]quinazoline, pyrimido[4,5-f]quinazoline, quinoline, benzoquinoline, pyrrolo[2,1-a]isoquinolin, benzofuro[2,3-d]pyridazine, thienopyrimidine, phosphine oxide, phosphole or mixtures thereof.

It is further preferred that the second organic matrix compound comprises a phosphine oxide compound substituted with $C_6$-$C_{40}$ aryl, $C_5$-$C_{40}$ heteroaryl and/or $C_1$-$C_{12}$ alkyl groups, preferably (3-(dibenzo[c,h]acridin-7-yl)phenyl)diphenylphosphine oxide, 3-phenyl-3H-benzo[b]dinaphtho[2,1-d:1',2'-f]phosphepine-3-oxide, phenyldi(pyren-1-yl)phosphine oxide, bis(4-(anthracen-9-yl)phenyl)(phenyl)phosphine oxide, (3-(9,10-di(naphthalen-2-yl)anthracen-2-yl)phenyl)diphenylphosphine oxide, phenyldi(pyren-1-yl)phosphine oxide, diphenyl(5-(pyren-1-yl)pyridin-2-yl)phosphine oxide, diphenyl(4'-(pyren-1-yl)-[1,1'-biphenyl]-3-yl)phosphine oxide, diphenyl(4'-(pyren-1-yl)-[1,1'-biphenyl]-3-yl)phosphine oxide, (3'-(dibenzo[c,h]acridin-7-yl)-[1,1'-biphenyl]-4-yl)diphenylphosphine oxide and/or phenyl bis(3-(pyren-1-yl)phenyl)phosphine oxide.

Diarylphosphine oxide compounds which may be used as second organic matrix compound are disclosed in EP 2395571 A1, WO2013079217 A1, EP 13187905, EP13199361 and JP2002063989 A1. Dialkylphosphine oxide compounds are disclosed in EP15195877.4.

It is further preferred that the second organic matrix compound comprises a benzimidazole compound substituted with $C_6$-$C_{40}$ aryl, $C_5$-$C_{40}$ heteroaryl and/or $C_1$-$C_{12}$ alkyl groups, preferably 2-(4-(9,10-di(naphthalen-2-yl)anthracene-2-yl)phenyl)-1-phenyl-1H-benzo[d]imidazole, 1-(4-(10-([1,1'-biphenyl]-4-yl)anthracen-9-yl)phenyl)-2-ethyl-1H-benzo[d]imidazole, and/or 1,3,5-tris(1-phenyl-1H-benzimidazol-2-yl)benzene.

Benzimidazole compounds that can be used as second organic matrix materials are disclosed in U.S. Pat. No. 6,878,469 and WO2010134352.

In a preferred embodiment, the second organic matrix compound comprises a quinoline compound. Suitable quinoline compounds are disclosed in US 20090108746 and US 20090166670.

In a preferred embodiment, the second organic matrix compound comprises a benzoquinoline compound. Suitable benzoquinoline compounds are disclosed in JP 2004281390 and US 20120280613.

In a preferred embodiment, the second organic matrix compound comprises a pyrimidine compound. Suitable pyrimidine compounds are disclosed in JP2004031004.

In a preferred embodiment, the second organic matrix compound comprises an oxazole compound. Preferred oxazole compounds are disclosed in JP2003007467 and WO2014163173.

In a preferred embodiment, the second organic matrix compound comprises an oxadiazole compound. Preferred oxadiazole compounds are disclosed in US2015280160.

In a preferred embodiment, the second organic matrix compound comprises an benzooxazole compound. Preferred benzooxazole compounds are disclosed in Shirota and Kageyama, Chem. Rev. 2007, 107, 953-1010.

In a preferred embodiment, the second organic matrix compound comprises a triazole compound. Suitable triazole compounds are disclosed in US2015280160.

In a preferred embodiment, the second organic matrix compound comprises a pyrimido[4,5-f]quinazoline compound. Suitable pyrimido[4,5-f]quinazoline compounds are disclosed in EP2504871.

In a preferred embodiment, the second organic matrix compound may be selected from the group consisting of a compound represented by Formula 2, and a compound represented by Formula 3 below:

Formula 2

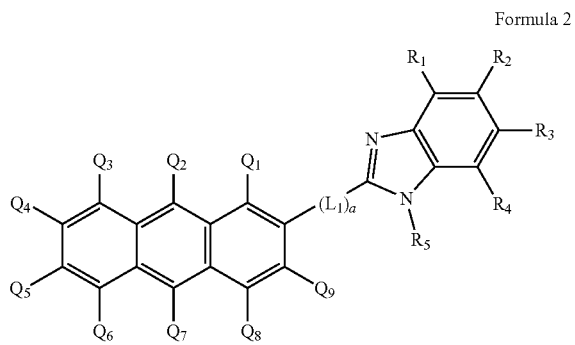

Formula 3

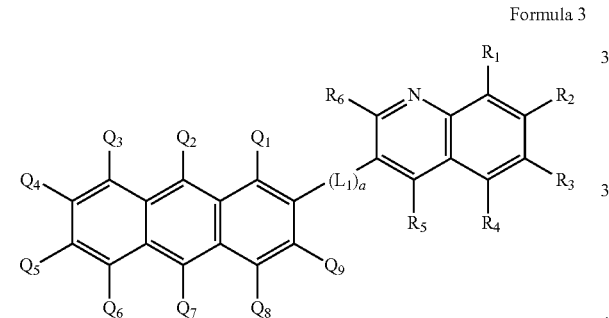

In Formulae 2 and 3, $R_1$ to $R_6$ are each independently a hydrogen atom, a halogen atom, a hydroxy group, a cyano group, a substituted or unsubstituted $C_1$-$C_{30}$ alkyl group, a substituted or unsubstituted $C_1$-$C_{30}$ alkoxy group, a substituted or unsubstituted $C_1$-$C_{30}$ acyl group, a substituted or unsubstituted $C_2$-$C_{30}$ alkenyl group, a substituted or unsubstituted $C_2$-$C_{30}$ alkynyl group, a substituted or unsubstituted $C_6$-$C_{30}$ aryl group, or a substituted or unsubstituted $C_3$-$C_{30}$ heteroaryl group. At least two adjacent $R_1$ to $R_6$ groups are optionally bonded to each other, to form a saturated or unsaturated ring. $L_1$ is a bond, a substituted or unsubstituted $C_1$-$C_{30}$ alkylene group, a substituted or unsubstituted $C_6$-$C_{30}$ arylene group, or a substituted or unsubstituted $C_3$-$C_{30}$ hetero arylene group. $Q_1$ through $Q_9$ are each independently a hydrogen atom, a substituted or unsubstituted $C_6$-$C_{30}$ aryl group, or a substituted or unsubstituted $C_3$-$C_{30}$ hetero aryl group, and "a" is an integer from 1 to 10.

For example, $R_1$ to $R_6$ may be each independently selected from the group consisting of a hydrogen atom, a halogen atom, a hydroxy group, a cyano group, a methyl group, an ethyl group, a propyl group, a butyl group, a methoxy group, an ethoxy group, a propoxy group, a butoxy group, a phenyl group, a naphthyl group, an anthryl group, a pyridinyl group, and a pyrazinyl group.

In particular, in Formula 2 and/or 3, $R_1$ to $R_4$ may each be a hydrogen atom, $R_5$ may be selected from the group consisting of a halogen atom, a hydroxy group, a cyano group, a methyl group, an ethyl group, a propyl group, a butyl group, a methoxy group, an ethoxy group, a propoxy group, a butoxy group, a phenyl group, a naphthyl group, an anthryl group, a pyridinyl group, and a pyrazinyl group. In addition, in Formula 3, $R_1$ to $R_6$ may each be a hydrogen atom.

For example, in Formula 2 and/or 3, $Q_1$ to $Q_9$ are each independently a hydrogen atom, a phenyl group, a naphthyl group, an anthryl group, a pyridinyl group, and a pyrazinyl group. In particular, in Formulae 2 and/or 3, $Q_1$, $Q_3$-$Q_6$, $Q_8$ and $Q_9$ are hydrogen atoms, and $Q_2$ and $Q_7$ may be each independently selected from the group consisting of a phenyl group, a naphthyl group, an anthryl group, a pyridinyl group, and a pyrazinyl group.

For example, $L_1$, in Formula 2 and/or 3, may be selected from the group consisting of a phenylene group, a naphthylene group, an anthrylene group, a pyridinylene group, and a pyrazinylene group. In particular, $L_1$ may be a phenylene group or a pyridinylene group. For example, "a" may be 1, 2, or, 3.

The second organic matrix compound may be further selected from Compound 5, 6, or 7 below:

Compound 6

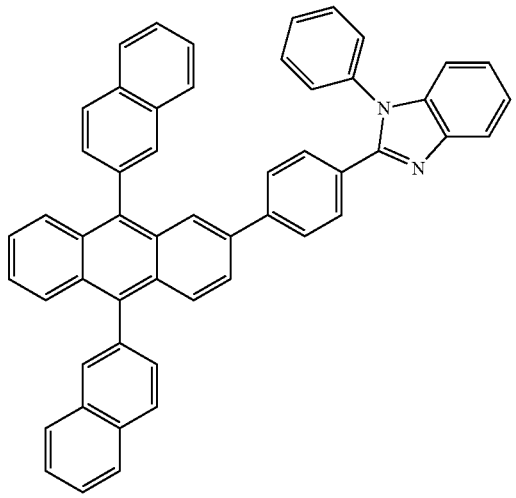

Compound 7

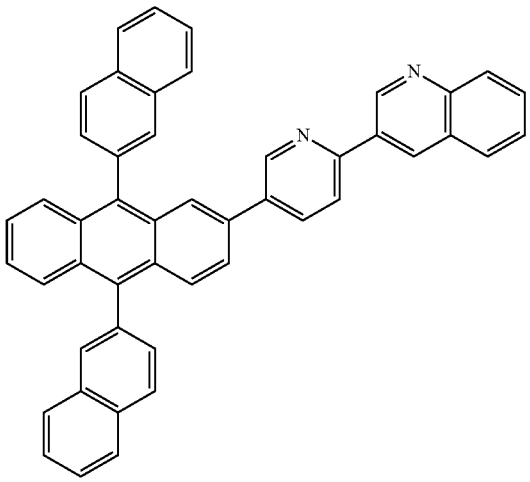

Preferably, the second organic matrix compound comprises a phenanthroline compound substituted with $C_6$-$C_{40}$ aryl, $C_5$-$C_{40}$ heteroaryl and/or $C_1$-$C_{12}$ alkyl groups, preferably 2,4,7,9-tetraphenyl-1,10-phenanthroline, 4,7-diphenyl-2,9-di-p-tolyl-1,10-phenanthroline, 2,9-di(biphenyl-4-yl)-4,7-diphenyl-1,10-phenanthroline and/or 3,8-bis(6-phenyl-2-pyridinyl)-1,10-phenanthroline.

Phenanthroline compounds that can be used as second organic matrix materials are disclosed in EP 1786050 A1 and CN102372708.

Other suitable second organic matrix compounds that can be used are quinazoline compounds substituted with aryl or heteroaryl groups, preferably 9-phenyl-9'-(4-phenyl-2-quinazolinyl)-3,3'-bi-9H-carbazole. It is further preferred that the first organic matrix compound comprises a quinazoline compound substituted with $C_6$-$C_{40}$ aryl, $C_5$-$C_{40}$ heteroaryl and/or $C_1$-$C_{12}$ alkyl groups, preferably 9-phenyl-9'-(4-phenyl-2-quinazolinyl)-3,3'-bi-9H-carbazole. Quinazoline compounds that can be used as first organic matrix materials are disclosed in KR2012102374.

It is further preferred that the second organic matrix compound comprises a benzo[h]quinazoline compound substituted with $C_6$-$C_{40}$ aryl, $C_5$-$C_{40}$ heteroaryl and/or $C_1$-$C_{12}$ alkyl groups, preferably 4-(2-naphthalenyl)-2-[4-(3-quinolinyl)phenyl]-benzo[h]quinazoline. Benzo[h]quinazoline compounds that can be used as first organic matrix materials are disclosed in KR2014076522.

It is also preferred that the second organic matrix compound comprises a pyrido[3,2-h]quinazoline compound substituted with $C_6$-$C_{40}$ aryl, $C_5$-$C_{40}$ heteroaryl and/or $C_1$-$C_{12}$ alkyl groups, preferably 4-(naphthalen-1-yl)-2,7,9-triphenylpyrido[3,2-h]quinazoline. Pyrido[3,2-h]quinazoline compounds that can be used as first organic matrix materials are disclosed in EP1970371.

In a further preferred embodiment, the second organic matrix compound is selected from acridine compounds. Suitable acridine compounds are disclosed in CN104650032.

According to another aspect, the electron transport layer can be in direct contact with the organic semiconductor layer according to the invention. If more than one electron transport layer is present, the organic semiconductor layer is contacting sandwiched between the first electron transport layer and the first cathode electrode layer. The second electron transport layer, if present, is contacting sandwiched between the emission layer and the first electron transport layer.

According to various embodiments of the OLED of the present invention the thicknesses of the electron transport layer may be in the range of about ≥0.5 nm to about ≤95 nm, preferably of about ≥3 nm to about ≤80 nm, further preferred of about ≥5 nm to about ≤60 nm, also preferred of about ≥6 nm to about ≤40 nm, in addition preferred about ≥8 nm to about ≤20 nm and more preferred of about ≥10 nm to about ≤18 nm.

According to various embodiments of the OLED of the present invention the thicknesses of the electron transport layer stack can be in the range of about ≥25 nm to about ≤100 nm, preferably of about ≥30 nm to about ≤80 nm, further preferred of about ≥35 nm to about ≤60 nm, and more preferred of about ≥36 nm to about ≤40 nm.

The ETL may be formed optional on an EML or on the HBL if the HBL is formed.

The ETL may have a stacked structure, preferably of two ETL-layers, so that injection and transport of electrons may be balanced and holes may be efficiently blocked. In a conventional OLED, since the amounts of electrons and holes vary with time, after driving is initiated, the number of excitons generated in an emission area may be reduced. As a result, a carrier balance may not be maintained, so as to reduce the lifetime of the OLED.

However, in the ETL, the first layer and the second layer may have similar or identical energy levels, so that the carrier balance may be uniformly maintained, while controlling the electrontransfer rate.

The organic light emitting device may comprise further electron transport layers, preferably a third and optional fourth electron transport layer, wherein the third and optional fourth electron transport layer is arranged between the charge generation layer and the cathode. Preferably, the first electron transport layer and third electron transport layer are selected the same, and the second and fourth electron transport layer are selected the same.

The ETL may be formed on the EML by vacuum deposition, spin coating, slot-die coating, printing, casting, or the like. When the ETL is formed by vacuum deposition or spin coating, the deposition and coating conditions may be similar to those for formation of the HIL. However, the deposition and coating conditions may vary, according to a compound that is used to form the ETL.

In another embodiment, the ETL may contain an alkali organic complex and/or alkali halide, preferably a lithium organic complex and/or lithium halide.

According to various aspects the lithium halide can be selected from the group comprising LiF, LiCl, LiBr or LiJ, and preferably LiF.

According to various aspects the alkali organic complex can be a lithium organic complex and preferably the lithium organic complex can be selected from the group comprising a lithium quinolate, a lithium borate, a lithium phenolate, a lithium pyridinolate or a lithium Schiff base and lithium fluoride, preferably a lithium 2-(diphenylphosphoryl)-phenolate, lithium tetra(1H-pyrazol-1-yl)borate, a lithium quinolate of formula (III), a lithium 2-(pyridin-2-yl)phenolate and LiF, and more preferred selected from the group comprising a lithium 2-(diphenylphosphoryl)-phenolate, lithium tetra(1H-pyrazol-1-yl)borate, a lithium quinolate of formula (III) and a lithium 2-(pyridin-2-yl)phenolate.

More preferred, the alkali organic complex is a lithium organic complex and/or the alkali halide is lithium halide.

Suitable lithium organic complexes are described in WO2016001283A1.

Charge Generation Layer

Charge generation layers (CGL) that can be suitable used for the OLED of the present invention are described in US 2012098012 A.

The charge generation layer is generally composed of a double layer. The charge generation layer can be a pn junction charge generation layer joining n-type charge generation layer and p-type charge generation layer. The pn junction charge generation layer generates charges or separates them into holes and electrons; and injects the charges into the individual light emission layer. In other words, the n-type charge generation layer provides electrons for the first light emission layer adjacent to the anode electrode while the p-type charge generation layer provides holes to the second light emission layer adjacent to the cathode electrode, by which luminous efficiency of an organic light emitting device incorporating multiple light emission layers can be further improved and at the same time, driving voltage can be lowered.

The n-type charge generation layer can be composed of metal or organic material doped with n-type. The metal can be one selected from a group consisting of Li, Na, K, Rb, Cs, Mg, Ca, Sr, Ba, La, Ce, Sm, Eu, Tb, Dy, and Yb. Also, n-type dopant and host used for organic material doped with the n-type can employ conventional materials. For example, the n-type dopant can be alkali metal, alkali metal compound, alkali earth metal, or alkali earth metal compound. More specifically, the n-type dopant can be one selected from a group consisting of Cs, K, Rb, Mg, Na, Ca, Sr, Eu and Yb. The host material can be one selected from a group consisting of tris(8-hydroxyquinoline)aluminum, triazine, hydroxyquinoline derivative, benzazole derivative, and silole derivative.

The p-type charge generation layer can be composed of metal or organic material doped with p-type dopant. Here, the metal can be one or an alloy consisting of two or more selected from a group consisting of Al, Cu, Fe, Pb, Zn, Au, Pt, W, In, Mo, Ni, and Ti. Also, p-type dopant and host used for organic material doped with the p-type can employ conventional materials. For example, the p-type dopant can be one selected from a group consisting of tetrafluoro-7,7, 8,8-tetracyanoquinodimethane (F4-TCNQ), derivative of tetracyanoquinodimethane, radialene derivative, iodine, FeCl3, FeF3, and SbCl5. Preferably, the p-type dopant is selected from radialene derivatives. The host can be one selected from a group consisting of N,N'-di(naphthalen-1-yl)N,N-diphenyl-benzidine (NPB), N,N'-diphenyl-N,N-bis(3-methylphenyl)-1,1-biphenyl-4,4'-diamine (TPD) and N,N',N'-tetranaphthyl-benzidine (TNB).

In another embodiment, the p-type charge generation layer is arranged adjacent to the organic semiconductor layer. The p-type charge generation layer according to one embodiment may include compounds of the following Chemical Formula 16.

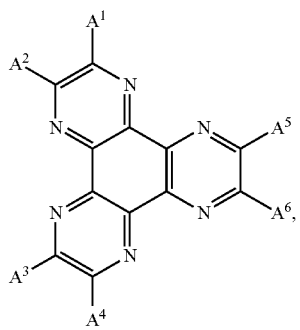

(16)

wherein
each of $A^1$ to $A^6$ may be hydrogen, a halogen atom, nitrile (—CN), nitro (—NO$_2$), sulfonyl (—SO$_2$R), sulfoxide (—SOR), sulfonamide (—SO$_2$NR), sulfonate (—SO$_3$R), trifluoromethyl (—CF$_3$), ester (—COOR), amide (—CONHR or —CONRR'), substituted or unsubstituted straight-chain or branched-chain C1-C12 alkoxy, substituted or unsubstituted straight-chain or branched-chain C1-C12 alkyl, substituted or unsubstituted straight-chain or branched chain C2-C12 alkenyl, a substituted or unsubstituted aromatic or non-aromatic heteroring, substituted or unsubstituted aryl, substituted or unsubstituted mono- or di-arylamine, substituted or unsubstituted aralkylamine, or the like.

Herein, each of the above R and R' may be substituted or unsubstituted C$_1$-C$_{60}$ alkyl, substituted or unsubstituted aryl, or a substituted or unsubstituted 5- to 7-membered heteroring, or the like.

Particularly preferred is an p-type charge generation layer comprising a compound of Formula (17)

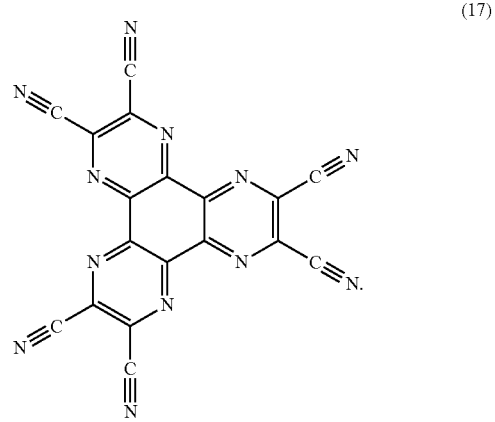 [SMILES: N#Cc1nc2c3nc(C#N)c(C#N)nc3c3nc(C#N)c(C#N)nc3c2nc1C#N]

(17)

The p-type charge generation layer is arranged on top of the n-type charge generation layer. As the materials for the p-type charge generation layer, aryl amine-based compounds may be used. One embodiment of the aryl amine-based compounds includes compounds of the following Chemical Formula 18:

(18)

wherein
$Ar_1$, $Ar_2$ and $Ar_3$ are each independently hydrogen or a hydrocarbon group. Herein, at least one of $Ar_1$, $Ar_2$ and $Ar_3$ may include aromatic hydrocarbon substituents, and each substituent may be the same, or they may be composed of different substituents. When $Ar_1$, $Ar_2$ and $Ar_3$ are not aromatic hydrocarbons, they may be hydrogen; a straight-chain, branched-chain or cyclic aliphatic hydrocarbon; or a heterocyclic group including N, O, S or Se.

In another aspect, an organic light emitting diode of the present invention is provided, wherein the organic light emitting diode further comprises a p-type charge generation layer, wherein the organic semiconductor layer is arranged between the first emission layer and the p-type charge generation layer. Preferably, the p-type charge generation layer comprises, more preferably consists of, a radialene dopant and a host.

In another embodiment, the p-type charge generation layer is in direct contact with the organic semiconductor layer of the present invention. Preferably, the p-type charge generation layer comprising or consisting of a radialene dopant and a host is in direct contact with the organic semiconductor layer.

In another aspect an organic light emitting diode of the present invention is provided which further comprising a p-type charge generation layer, wherein the p-type charge generation layer is arranged between the organic semiconductor layer and the cathode electrode. If the cathode electrode is transparent to visible light emission, this arrangement may enable efficient electron injection into the emission layer.

Organic Light Emitting Diode (OLED)

According to another aspect of the present invention, there is provided an organic light emitting diode (OLED) comprising: a substrate, an anode electrode, a hole injection layer, a hole transport layer, optional an electron blocking layer, an emission layer, optional a hole blocking layer, optional an electron transport layer, the inventive organic semiconductor layer, optional an electron injection layer and a cathode electrode layer, wherein the layers are arranged in that order.

According to another aspect of the present invention, there is provided an organic light emitting diode (OLED) comprising: a substrate, an anode electrode a first hole injection layer, a first hole transport layer, optional first electron blocking layer, a first emission layer, optional a first hole blocking layer, optional a first electron transport layer, optional an organic semiconductor layer of the present invention, an n-type charge generation layer, a p-type charge generation layer, a second hole transport layer, optional second electron blocking layer a second emission layer, optional a second hole blocking layer, optional a second electron transport layer, the organic semiconductor layer, optional an electron injection layer and a transparent cathode electrode layer, wherein the layers are arranged in that order.

According to various embodiments of the OLED of the present invention, the OLED may not comprises an electron transport layer.

According to various embodiments of the OLED of the present invention, the OLED may not comprises an electron blocking layer.

According to various embodiments of the OLED of the present invention, the OLED may not comprises a hole blocking layer.

According to various embodiments of the OLED of the present invention, the OLED may not comprises a charge generation layer.

According to various embodiments of the OLED of the present invention, the OLED may not comprises a second emission layer.

Electronic Device

Another aspect is directed to an electronic device comprising at least one organic light-emitting diode (OLED). A device comprising organic light emitting diodes (OLED) is for example a display or a lighting panel.

Additional aspects and/or advantages of the invention will be set forth in part in the description which follows and, in part, will be obvious from the description, or may be learned by practice of the invention.

Method of Manufacture

As mentioned before, the invention relates to a method of manufacturing an inventive organic light emitting diode comprising the steps of sequentially forming an anode electrode, at least one emission layer, at least one organic semiconductor layer, and a transparent cathode electrode on a substrate, and forming the at least one organic semiconductor layer by co-depositing a first zero-valent metal dopant together with a first matrix compound comprising at least two phenanthrolinyl groups, preferably two to four phenanthrolinyl groups.

The term co-deposition in this regard is particularly related to depositing the first zero-valent metal dopant from a first evaporation source and the first matrix compound of Formula 1, preferably from a second evaporation source.

However, it is also in accordance with the invention that the organic light emitting diode is manufactured by sequentially forming a transparent cathode electrode on a substrate, at least one organic semiconductor layer, at least one emission layer and an anode electrode, wherein, again, the at least one organic semiconductor layer is formed by co-depositing a first zero-valent metal dopant together with a first matrix compound comprising at least two phenanthrolinyl groups, preferably two to four phenanthrolinyl groups.

Depositing in terms of the invention may be achieved by depositing via vacuum thermal evaporation, sputtering or depositing via solution processing, preferably, the processing being selected from spin-coating, printing, casting and/or slot-die coating.

It is preferred that depositing the organic semiconductor layer comprises vacuum thermal evaporation.

In another embodiment, the organic semiconductor layer is formed by co-depositing a first zero-valent metal dopant together with a first matrix compound comprising at least two phenanthrolinyl groups in the same evaporation chamber.

Surprisingly, it has been found that even alkali metal dopants can be co-deposited with the first matrix compound. Thereby, shorter tact time and a more reliable process can be achieved.

According to another embodiment the method comprises a further step of depositing an electron transport layer on the emission layer. In this case, it is clear that the organic semiconductor layer is deposited on the electron transport layer instead. Higher efficiency may be achieved when the emission layer is not in direct contact with the organic semiconductor layer of the present invention.

According to various embodiments of the present invention, the method may further include forming on a substrate an anode electrode a hole injection layer, a hole transport layer, optional an electron blocking layer, an emission layer, optional a hole blocking layer, optional an electron transport layer, the organic semiconductor layer, optional an electron injection layer, and a transparent cathode electrode layer, wherein the layers are arranged in that order; or the layers can be deposited the other way around, starting with the transparent cathode electrode layer, and more preferred the organic semiconductor layer is be deposited before the transparent cathode electrode layer is deposited.

Particularly low operating voltage and/or high external quantum efficiency EQE may be achieved when the organic semiconductor layer is deposited before the first transparent cathode electrode layer.

According to various embodiments of the present invention, the method may further include forming on a substrate an anode electrode a first hole injection layer, a first hole transport layer, optional first electron blocking layer, a first emission layer, optional a first hole blocking layer, optional a first electron transport layer, optional the organic semiconductor layer of the present invention, an p-type charge generation layer, a second hole transport layer, optional second electron blocking layer, a second emission layer, optional a second hole blocking layer, optional a second electron transport layer, the organic semiconductor layer, and a transparent cathode electrode layer, wherein the layers are arranged in that order; or the layers are deposited the other way around, starting with the transparent cathode electrode layer; and more preferred the organic semiconductor layer is be deposited before the cathode electrode layer is deposited.

However, according to one aspect the layers are deposited the other way around, starting with the cathode electrode, and sandwiched between the transparent cathode electrode and the anode electrode.

For example, starting with the transparent cathode electrode layer, the organic semiconductor layer, optional electron transport layer, optional hole blocking layer, emission layer, optional electron blocking layer, hole transport layer, hole injection layer, anode electrode, exactly in this order.

The anode electrode and/or the transparent cathode electrode can be deposited on a substrate. Preferably the anode is deposited on a substrate.

According to another aspect of the present invention, there is provided a method of manufacturing an organic light-emitting diode (OLED), the method using:
- at least one deposition source, preferably two deposition sources and more preferred at least three deposition sources; and/or
- deposition via vacuum thermal evaporation (VTE); and/or
- deposition via solution processing, preferably the processing is selected from spin-coating, printing, casting and/or slot-die coating.

Additional aspects and/or advantages of the invention will be set forth in part in the description which follows and, in part, will be obvious from the description, or may be learned by practice of the invention.

BRIEF DESCRIPTION OF THE DRAWINGS

These and/or other aspects and advantages of the present invention will become apparent and more readily appreciated from the following description of the exemplary embodiments, taken in conjunction with the accompanying drawings, of which.

DETAILED DESCRIPTION

Figure 1:
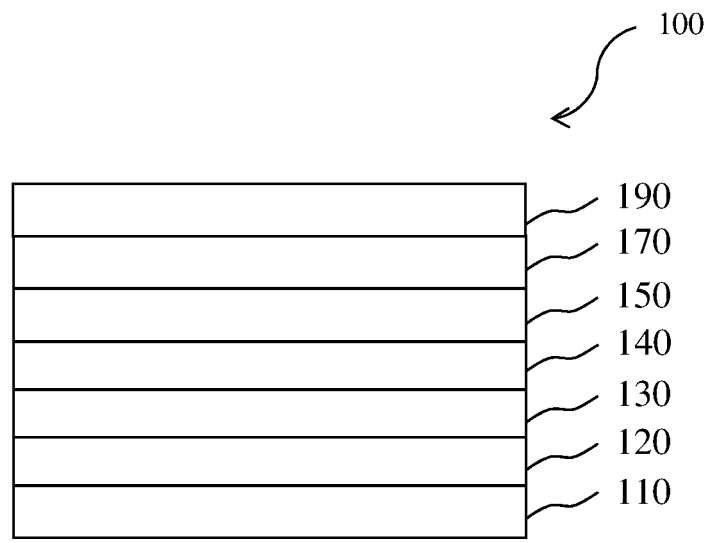
FIG. 1 is a schematic sectional view of an organic light-emitting diode (OLED), according to an exemplary embodiment of the present invention.

Reference will now be made in detail to the exemplary embodiments of the present invention, examples of which are illustrated in the accompanying drawings, wherein like reference numerals refer to the like elements throughout. The exemplary embodiments are described below, in order to explain the aspects of the present invention, by referring to the figures.

Herein, when a first element is referred to as being formed or disposed "on" a second element, the first element can be disposed directly on the second element, or one or more other elements may be disposed there between. When a first element is referred to as being formed or disposed "directly on" a second element, no other elements are disposed there between.

FIG. 1 is a schematic sectional view of an organic light-emitting diode (OLED) 100, according to an exemplary embodiment of the present invention. The OLED 100 includes a substrate 110, an anode electrode 120, a hole injection layer (HIL) 130, a hole transport layer (HTL) 140, an emission layer (EML) 150. Onto the emission layer (EML) 150 the organic semiconductor layer 170 is disposed. The organic semiconductor layer 170 comprising or consisting of a substantially metallic rare earth metal dopant and a first matrix compound comprising at least two phenanthrolinyl groups, preferably comprising formula 1, is formed directly on the EML 150. The transparent cathode electrode layer 190 is disposed directly onto the organic semiconductor layer 170.

Figure 2:
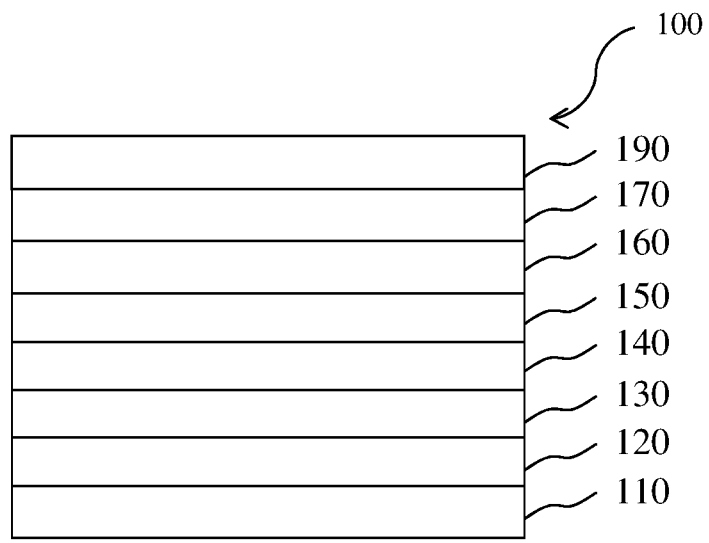
FIG. 2 is a schematic sectional view of an OLED, according to another exemplary embodiment of the present invention.

FIG. 2 is a schematic sectional view of an OLED 100, according to another exemplary embodiment of the present invention. FIG. 2 differs from FIG. 1 in that the OLED 100 of FIG. 2 comprises an electron transport layer 160.

Referring to FIG. 2 the OLED 100 includes a substrate 110, an anode electrode 120, a hole injection layer (HIL) 130, a hole transport layer (HTL) 140, an emission layer (EML) 150. Onto the emission layer (EML) 150 an electron transport layer (ETL) 160 is disposed. Onto the electron transport layer (ETL) 160 the organic semiconductor layer 170 is disposed. The organic semiconductor layer 170 comprising or consisting of a substantially metallic rare earth metal dopant and a first matrix compound comprising at least two phenanthrolinyl groups, preferably comprising of formula 1 is formed directly on the ETL 160. The transparent cathode electrode layer 190 is disposed directly onto the organic semiconductor layer 170.

Figure 3:
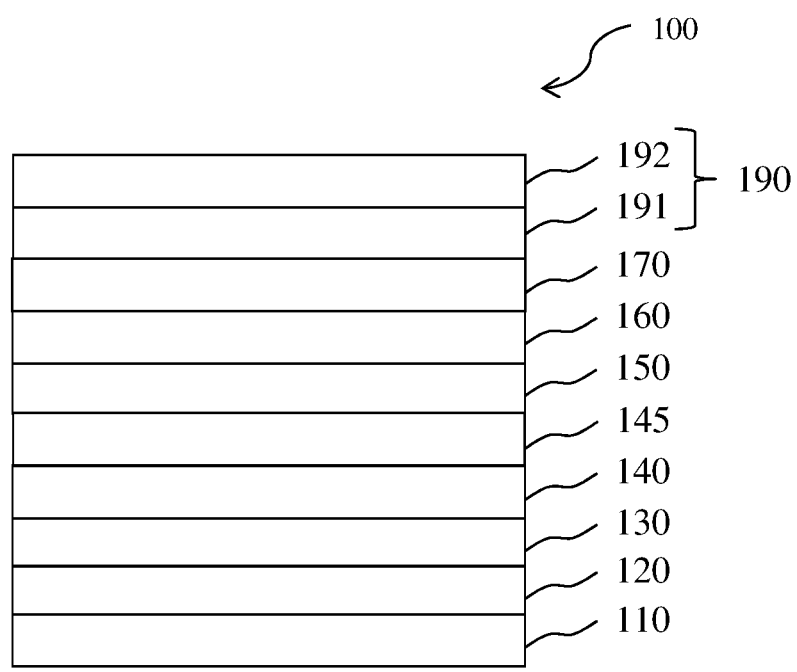
FIG. 3 is a schematic sectional view of an OLED, according to another exemplary embodiment of the present invention.

FIG. 3 is a schematic sectional view of an OLED 100, according to another exemplary embodiment of the present invention. FIG. 3 differs from FIG. 2 in that the OLED 100 of FIG. 3 comprises an electron blocking layer (EBL) 145 and a cathode electrode 190 comprising a first transparent cathode layer 191 and a second transparent cathode layer 192.

Referring to FIG. 3 the OLED 100 includes a substrate 110, an anode electrode 120, a hole injection layer (HIL) 130, a hole transport layer (HTL) 140, an electron blocking layer (EBL) 145 and an emission layer (EML) 150. Onto the emission layer (EML) 150 an electron transport layer (ETL) 160 is disposed. Onto the electron transport layer (ETL) 160 the organic semiconductor layer 170 is disposed. The organic semiconductor layer 170 comprising or consisting of a substantially metallic rare earth metal dopant and a first matrix compound comprising at least two phenanthrolinyl groups, preferably comprising of formula 1 is formed directly on the ETL 160. The transparent cathode electrode layer 190 comprises of a first transparent cathode layer 191 and a second transparent cathode layer 191. The first transparent cathode layer 191 is a substantially metallic layer and it is disposed directly onto the organic semiconductor layer 170. The second transparent cathode layer 192 is disposed directly onto the first transparent cathode layer 191.

Figure 4:
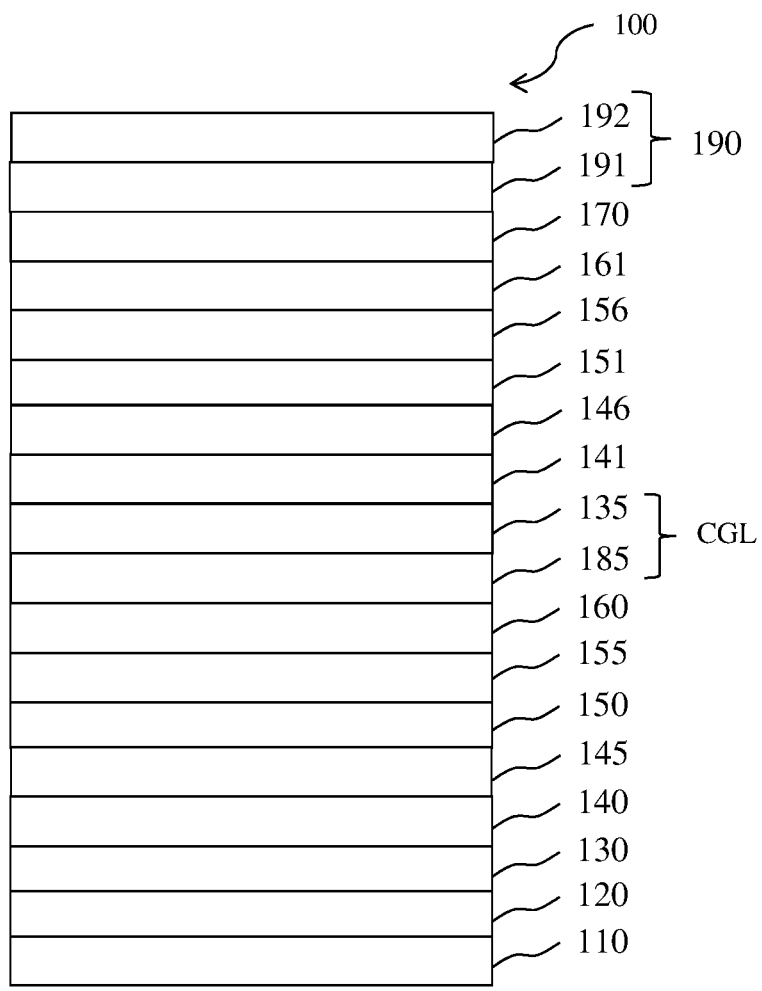
FIG. 4 is a schematic sectional view of a tandem OLED comprising a charge generation layer, according to an exemplary embodiment of the present invention.

FIG. 4 is a schematic sectional view of a tandem OLED 100, according to another exemplary embodiment of the present invention. FIG. 4 differs from FIG. 2 in that the OLED 100 of FIG. 4 further comprises a charge generation layer and a second emission layer.

Referring to FIG. 4 the OLED 100 includes a substrate 110, an anode electrode 120, a first hole injection layer (HIL) 130, a first hole transport layer (HTL) 140, a first electron blocking layer (EBL) 145, a first emission layer (EML) 150, a first hole blocking layer (HBL) 155, a first electron transport layer (ETL) 160, an n-type charge generation layer (n-type CGL) 185, a p-type charge generation layer (p-type GCL) 135, a second hole transport layer (HTL) 141, a second electron blocking layer (EBL) 146, a second emission layer (EML) 151, a second hole blocking layer (EBL) 156, a second electron transport layer (ETL) 161, the organic semiconductor layer 170, a first transparent cathode electrode layer 191 and a second transparent cathode electrode layer 192. The organic semiconductor layer 170 comprising or consisting of a substantially metallic rare earth metal dopant and a first matrix compound comprising at least two phenanthrolinyl groups, preferably comprising of formula 1, is disposed directly onto the second electron transport layer 161 and the first transparent cathode electrode layer 191 is disposed directly onto the organic semiconductor layer 170. The second transparent cathode electrode layer 192 is disposed directly onto the first transparent cathode electrode layer 191. Optionally, the n-type charge generation layer (n-type CGL) 185 may be the organic semiconductor layer of the present invention.

In the description above the method of manufacture an OLED 100 of the present invention is started with a substrate 110 onto which an anode electrode 120 is formed, on the anode electrode 120, a first hole injection layer 130, first hole transport layer 140, optional a first electron blocking layer 145, a first emission layer 150, optional a first hole blocking layer 155, optional an ETL 160, an n-type CGL 185, a p-type CGL 135, a second hole transport layer 141, optional a second electron blocking layer 146, a second emission layer 151, an optional second hole blocking layer 156, an optional at least one second electron transport layer 161, the organic semiconductor layer 170, an optional first transparent cathode electrode layer 191 and a second transparent cathode electrode layer 192 are formed, in that order or the other way around.

While not shown in FIG. 1, FIG. 2, FIG. 3 and FIG. 4, a sealing layer may further be formed on the cathode electrodes 190, in order to seal the OLEDs 100. In addition, various other modifications may be applied thereto.

EXAMPLES

First matrix compounds comprising at least two phenanthrolinyl groups can be synthesized as described in JP2002352961.

Top Emission Devices

For top emission devices—Examples 1 to 3 and comparative examples 1 to 7, a glass substrate was cut to a size of 50 mm×50 mm×0.7 mm, ultrasonically cleaned with isopropyl alcohol for 5 minutes and then with pure water for 5 minutes, and cleaned again with UV ozone for 30 minutes. Then, 100 nm Ag was deposited on the glass substrate to form the first anode electrode.

Then, 92 wt.-% of Biphenyl-4-yl(9,9-diphenyl-9H-fluoren-2-yl)-[4-(9-phenyl-9H-carbazol-3-yl)phenyl]-amine (CAS 1242056-42-3) and 8 wt.-% of 2,2',2"-(cyclopropane-1,2,3-triylidene)tris(2-(p-cyanotetrafluorophenyl)acetonitrile) was vacuum deposited on the anode electrode, to form a HIL having a thickness of 10 nm. Then Biphenyl-4-yl(9,9-diphenyl-9H-fluoren-2-yl)-[4-(9-phenyl-9H-carbazol-3-yl)phenyl]-amine was vacuum deposited on the HIL, to form a HTL having a thickness of 130 nm. 97 wt.-% of ABH113 (Sun Fine Chemicals) as a host and 3 wt.-% of NUBD370 (Sun Fine Chemicals) as a dopant were deposited on the HTL, to form a blue-emitting EML with a thickness of 20 nm.

Then, the organic semiconductor layer is formed by deposing a matrix compound and metal dopant according to examples 1 to 3 and comparative example 1 and 7 by deposing the matrix compound from a first deposition source and zero-valent metal dopant from a second deposition source directly on the EML. The composition of the organic semiconductor layer can be seen in Table 1. In examples 1 to 3 and comparative examples 6 and 7 the matrix compound is a compound of formula 1. The thickness of the organic semiconductor layer can be seen in Table 1.

In comparative example 7, a sputter protection layer of 30 nm CNHAT is deposed directly on the organic semiconductor layer.

Then the transparent cathode electrode is deposited. In example 1 to 3 and comparative examples 1 to 7, a layer of 100 nm ITO is formed using a RF magnetron sputtering process.

Transparent Devices

For transparent devices, a 15 Ω/cm 2 glass substrate with 90 nm ITO (available from Corning Co.) was cut to a size of 50 mm×50 mm×0.7 mm, ultrasonically cleaned with isopropyl alcohol for 5 minutes and then with pure water for 5 minutes, and cleaned again with UV ozone for 30 minutes, to prepare a first transparent anode electrode.

Then the HIL, HTL, optional EBL, EML, optional HBL, optional ETL, organic semiconductor layer and transparent cathode are deposited as described for top emission devices.

The OLED stack is protected from ambient conditions by deposition of a capping layer and/or encapsulation of the device with a glass slide. Thereby, a cavity is formed, which includes a getter material for further protection.

To assess the performance of the inventive examples compared to the prior art, the current efficiency is measured under ambient conditions (20° C.). Current voltage measurements are performed using a Keithley 2400 sourcemeter, and recorded in V. At 10 mA/cm$^2$ for top emission devices, a calibrated spectrometer CAS140 from Instrument Systems is used for measurement of CIE coordinates and brightness in Candela. Lifetime LT of top emission device is measured at ambient conditions (20° C.) and 8 mA/cm$^2$, using a Keithley 2400 sourcemeter, and recorded in hours. The brightness of the device is measured using a calibrated photo diode. The lifetime LT is defined as the time till the brightness of the device is reduced to 97% of its initial value.

To determine the efficiency EQE in % the light output of the device is measured using a calibrated photodiode at 10 mA/cm2.

To determine the yield of working devices, the absolute number of working devices is divided by the number of devices tested in total and reported in percent. Typically, 32 devices are tested. Failed devices are defined as having an operating voltage below 2.8 V and external quantum efficiency below 0.5% at a current density of 10 mA/cm$^2$. In other words, failed devices draw current without formation of excitons. Working devices are defined as having an operating voltage above 2.8 V and external quantum efficiency above 0.5% at a current density of 10 mA/cm$^2$.

Technical Effect of the invention

In Table 1, the operating voltage and yield of working devices is shown for OLEDs comprising a fluorescent blue emission layer, an organic semiconductor layer comprising a first matrix compound and a metal dopant.

In comparative examples 1 to 5, ETM-1 is used as first matrix compound

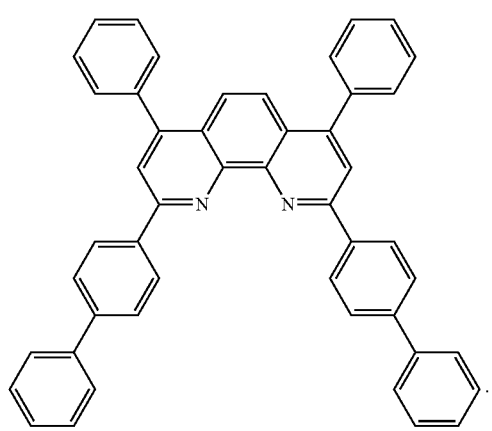

ETM-1

ETM-1 comprises a single phenanthrolinyl group.

In comparative example 1, an organic semiconductor layer of 36 nm ETM-1 doped with 0.5 wt.-% Li is formed in direct contact with the transparent cathode electrode. The operating voltage is 4.25 V and the yield is 37.5%.

In comparative example 2, the thickness of the organic semiconductor layer has the same composition as in comparative example 1 but the thickness is increased to 177 nm. The operating voltage remains unchanged at 4.3 V and the yield is increased to 50%.

In comparative example 3, Ca is used as first zero-valent metal dopant instead of Li. The operating voltage is increased dramatically to 6.5 V and the yield is low 37.5%.

In comparative example 4, the thickness of the organic semiconductor layer is increased to 177 nm. All devices failed.

In comparative example 5, Yb is used as first zero-valent metal dopant instead of Li. Again, the operating voltage is very high at 6.65 V but the yield is improved to 81%.

In comparative example 6, MX1 is used as first matrix compound. MX1 comprises two phenanthrolinyl groups. The first zero-valent metal dopant is Li and the thickness of the organic semiconductor layer is 36 nm. Compared to comparative example 1, the operating voltage is reduced by 1 V to 3.3 V but the yield is still low at 56% working devices.

In comparative example 7, the organic semiconductor layer has the same composition as above, but the thickness is 77 nm. Additionally, a sputter protection layer of 30 nm CNHAT is arranged between the organic semiconductor layer and the transparent cathode electrode. The yield is improved to 62.5% working devices at the expense of a much higher operating voltage.

In example 1, the organic semiconductor layer has the same composition as above but the thickness is 177 nm. The operating voltage is very low and unchanged compared to comparative example 6, even though the thickness is much higher. The yield is improved dramatically from 56 to 94% working devices.

In example 2, Ca is used as first zero-valent metal dopant instead of Li. The operating voltage is 4.4 V and the yield is still much improved at 75% working devices.

In example 3, Yb is used as first zero-valent metal dopant instead of Li. The operating voltage is 4.1 V and the yield is still much improved at 78% working devices.

In summary, a substantial increase in working devices has been achieved without detrimental effect on operating voltage. This effect is achieved without a sputter protection layer. By depositing fewer layers, the tact time can be increased in mass manufacturing of OLEDs.

Additionally, a substantial reduction in operating voltage has been achieved for a first matrix compound comprising at least two phenanthrolinyl groups compared to matrix compounds comprising one phenanthrolinyl group.

A lower operating voltage offers the benefit of lower power consumption and longer battery life in mobile devices.

The features disclosed in the foregoing description, in the claims and the accompanying drawings may, both separately or in any combination thereof be material for realizing the invention in diverse forms thereof.

TABLE 1

Device performance of top emission devices comprising the organic semiconductor layer of the present invention in direct contact with the transparent cathode electrode

| | First matrix compound | Metal dopant | wt.-% metal dopant | mol.-% metal dopant | Thickness organic semiconductor layer [nm] | Sputter protection material | Thickness sputter protection layer [nm] | Voltage at 10 mA/cm$^2$ [V] | Yield of working devices [%] |
|---|---|---|---|---|---|---|---|---|---|
| Comparative example 1 | ETM-1 | Li | 0.5 | 32 | 36 | — | — | 4.25 | 37.5 |
| Comparative example 2 | ETM-1 | Li | 0.5 | 32 | 177 | — | — | 4.3 | 50 |
| Comparative example 3 | ETM-1 | Ca | 1.2 | 16 | 36 | — | — | 6.5 | 37.5 |
| Comparative example 4 | ETM-1 | Ca | 1.2 | 16 | 177 | — | — | — | 0 |
| Comparative example 5 | ETM-1 | Yb | 5 | 16 | 36 | — | — | 6.65 | 81 |
| Comparative example 6 | MX1 | Li | 0.5 | 30 | 36 | — | — | 3.3 | 56 |
| Comparative example 7 | MX1 | Li | 0.5 | 30 | 77 | CNHAT | 30 | 4.6 | 62.5 |
| Example 1 | MX1 | Li | 0.5 | 30 | 177 | — | — | 3.3 | 94 |
| Example 2 | MX1 | Ca | 1.2 | 15 | 177 | — | — | 4.4 | 75 |
| Example 3 | MX1 | Yb | 5 | 15 | 177 | — | — | 4.1 | 78 |

The invention claimed is:

1. Organic light emitting diode comprising an anode electrode, a transparent cathode electrode, at least one emission layer and at least one organic semiconductor layer, wherein the at least one emission layer and the at least one organic semiconductor layer is arranged between the anode electrode and the transparent cathode electrode and the organic semiconductor layer comprises a first zero-valent metal dopant and a first matrix compound wherein the first matrix compound comprises at least two phenanthrolinyl groups;
wherein the first zero-valent metal dopant is selected from the group consisting of alkali metal, alkaline earth metal, rare earth metal, Group 3 transition metal and mixtures thereof;
wherein the organic semiconductor layer has a thickness of 100 to 500 nm; and
wherein the organic semiconductor layer is in direct contact with the transparent cathode electrode layer.

2. Organic light emitting diode according to claim 1, wherein the first matrix compound is a compound of Formula 1

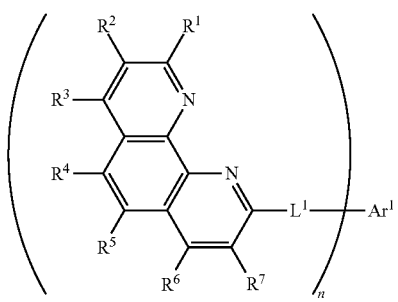

Formula 1 wherein $R^1$ to $R^7$ are each independently selected from hydrogen, substituted or unsubstituted $C_6$ to $C_{18}$ aryl group, substituted or unsubstituted pyridyl group, substituted or unsubstituted quinolyl group, substituted or unsubstituted $C_1$ to $C_{16}$ alkyl group, substituted or unsubstituted $C_1$ to $C_{16}$ alkoxy group, hydroxyl group or carboxyl group, and/or wherein adjacent groups of the respective $R^1$ to $R^7$ may be bonded to each other to form a ring;
$L^1$ is a single bond or selected from the group consisting of a $C_6$ to $C_{30}$ arylene group, a $C_5$ to $C_{30}$ heteroarylene group, a $C_1$ to $C_8$ alkylene group and a $C_1$ to $C_8$ alkoxyalkylene group;
$Ar^1$ is a substituted or unsubstituted $C_6$ to $C_{18}$ aryl group or a pyridyl group; and
n is an integer from 2 to 4, wherein each of the n phenanthrolinyl groups within the parentheses may be the same or different from each other.

3. Organic light emitting diode according to claim 1, wherein the transparent cathode electrode comprises a transparent conductive oxide, a metal sulfide, Ag or mixtures thereof.

4. Organic light emitting diode according to claim 1, wherein the organic light emitting diode comprises a first organic semiconductor layer and a second organic semiconductor layer and the organic light emitting diode further comprises a first emission layer and a second emission layer and the first organic semiconductor layer is arranged between the first emission layer and the second emission layer and the second organic semiconductor layer is arranged between the transparent cathode electrode and the emission layer arranged closest to the transparent cathode electrode.

5. Organic light emitting diode according to claim 1, wherein the organic light emitting diode further comprises at least one electron transport layer, wherein the one or more electron transport layer is arranged between the one or more emission layer and the one or more organic semiconductor layer.

6. Organic light emitting diode according to claim 5, wherein the electron transport layer comprises a polar first matrix compound or a non-polar first matrix compound.

7. Organic light emitting diode according to claim 1, wherein the first zero-valent metal dopant is selected from alkaline earth metal and rare earth metal.

8. Organic light emitting diode according to claim 1, wherein the first zero-valent metal dopant is comprised in the organic semiconductor layer in an amount of more than 1 wt.-%, based on the total weight of the organic semiconductor layer.

9. Organic light emitting diode according to claim 1, wherein n is 2 or 3.

10. Organic light emitting diode according to claim 1, wherein $L^1$ is a single bond.

11. Organic light emitting diode according to claim 1, wherein $Ar^1$ is phenylene.

12. Organic light emitting diode according to claim 1, wherein $R^1$ to $R^7$ are independently selected from the group consisting of hydrogen, $C_1$ to $C_4$ alkyl, $C_1$ to $C_4$ alkoxy, $C_6$ to $C_{12}$ aryl and $C_5$ to $C_{12}$ heteroaryl.

13. A method for preparing an organic light emitting diode according to claim 1, wherein the method comprises a step of co-deposition of a first matrix compound comprising at least two phenanthrolinyl groups together with a first zero-valent metal dopant; wherein the first zero-valent metal dopant is selected from the group consisting of alkali metal, alkaline earth metal, rare earth metal, Group 3 transition metal and mixtures thereof.

14. Method according to claim 13, wherein the process further comprises depositing the transparent cathode electrode using a sputtering process.

15. Organic light emitting diode according to claim 6, wherein the electron transport layer comprises a non-polar first matrix compound.

16. Organic light emitting diode according to claim 1, wherein the first zero-valent metal dopant is comprised in the organic semiconductor layer in an amount of more than 3 wt.-%, based on the total weight of the organic semiconductor layer.

17. Organic light emitting diode according to claim 9, wherein n is 2.

18. Organic light emitting diode according to claim 12, wherein $R^1$ to $R^7$ are independently selected from the group consisting of hydrogen, $C_1$ to $C_4$ alkyl and phenyl.

* * * * *